(12) United States Patent
Yamazaki et al.

(10) Patent No.: US 9,761,588 B2
(45) Date of Patent: Sep. 12, 2017

(54) SEMICONDUCTOR DEVICE HAVING A WIDE-GAP SEMICONDUCTOR LAYER IN AN INSULATING TRENCH

(71) Applicant: Semiconductor Energy Laboratory Co., Ltd., Atsugi-shi, Kanagawa-ken (JP)

(72) Inventors: Shunpei Yamazaki, Setagaya (JP); Hiromichi Godo, Isehara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/922,882

(22) Filed: Oct. 26, 2015

(65) Prior Publication Data

US 2016/0049405 A1 Feb. 18, 2016

Related U.S. Application Data

(62) Division of application No. 13/354,599, filed on Jan. 20, 2012, now Pat. No. 9,209,092.

(30) Foreign Application Priority Data

Jan. 26, 2011 (JP) .................. 2011-014628
May 19, 2011 (JP) .................. 2011-112673

(51) Int. Cl.
  *H01L 27/12* (2006.01)
  *H01L 29/04* (2006.01)
  (Continued)

(52) U.S. Cl.
  CPC ............ *H01L 27/108* (2013.01); *H01L 21/84* (2013.01); *H01L 27/0688* (2013.01);
  (Continued)

(58) Field of Classification Search
  CPC .............. H01L 29/785; H01L 29/7853; H01L 29/7854; H01L 29/7813; H01L 29/7825;
  (Continued)

(56) References Cited

U.S. PATENT DOCUMENTS 5,317,432 A 5/1994 Ino
5,731,856 A 3/1998 Kim et al.
(Continued)

FOREIGN PATENT DOCUMENTS

CN 001734769 A 2/2006
CN 101162737 A 4/2008
(Continued)

OTHER PUBLICATIONS

Kim.K, "Technology for sub-50nm DRAM and NAND Flash Manufacturing", IEDM 05: Technical Digest of International Electron Devices Meeting, Dec. 5, 2005, pp. 333-336.
(Continued)

*Primary Examiner* — Kevin Parendo
(74) *Attorney, Agent, or Firm* — Robinson Intellectual Property Law Office; Eric J. Robinson

(57) ABSTRACT

A conventional DRAM needs to be refreshed at an interval of several tens of milliseconds to hold data, which results in large power consumption. In addition, a transistor therein is frequently turned on and off; thus, deterioration of the transistor is also a problem. These problems become significant as the memory capacity increases and transistor miniaturization advances. A transistor is provided which includes a wide-gap semiconductor and has a trench structure including a trench for a gate electrode and a trench for element isolation. Even when the distance between a source electrode and a drain electrode is decreased, the occurrence of a short-channel effect can be suppressed by setting the depth of the trench for the gate electrode as appropriate.

11 Claims, 15 Drawing Sheets

(51) Int. Cl.

| | |
|---|---|
| *H01L 29/06* | (2006.01) |
| *H01L 29/423* | (2006.01) |
| *H01L 29/66* | (2006.01) |
| *H01L 29/78* | (2006.01) |
| *H01L 29/786* | (2006.01) |
| *H01L 27/108* | (2006.01) |
| *H01L 21/84* | (2006.01) |
| *H01L 27/06* | (2006.01) |
| *H01L 27/1156* | (2017.01) |
| *H01L 49/02* | (2006.01) |
| *H01L 29/20* | (2006.01) |
| *H01L 29/24* | (2006.01) |
| *H01L 29/36* | (2006.01) |

(52) U.S. Cl.
CPC ...... *H01L 27/1156* (2013.01); *H01L 27/1207* (2013.01); *H01L 28/40* (2013.01); *H01L 29/045* (2013.01); *H01L 29/0653* (2013.01); *H01L 29/0688* (2013.01); *H01L 29/2003* (2013.01); *H01L 29/24* (2013.01); *H01L 29/36* (2013.01); *H01L 29/4236* (2013.01); *H01L 29/42364* (2013.01); *H01L 29/66621* (2013.01); *H01L 29/78* (2013.01); *H01L 29/7869* (2013.01); *H01L 27/1225* (2013.01); *H01L 29/7833* (2013.01)

(58) Field of Classification Search
CPC ........... H01L 29/66621; H01L 29/4236; H01L 29/7397
See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,635,526 B1 | 10/2003 | Malik et al. | |
| 6,690,598 B2 | 2/2004 | Oguchi et al. | |
| 6,727,522 B1 | 4/2004 | Kawasaki et al. | |
| 6,791,863 B2 | 9/2004 | Oguchi et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,221,056 B2 | 5/2007 | Yamamoto et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,414,278 B2 | 8/2008 | Sugatani et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,511,343 B2 | 3/2009 | Li et al. | |
| 7,576,389 B2 | 8/2009 | Tanaka | |
| 7,674,650 B2 | 3/2010 | Akimoto et al. | |
| 7,692,973 B2 | 4/2010 | Miyazaki et al. | |
| 7,732,819 B2 | 6/2010 | Akimoto et al. | |
| 7,755,105 B2 | 7/2010 | Honda | |
| 7,755,126 B2 | 7/2010 | Kondo | |
| 7,795,096 B2 | 9/2010 | Wang | |
| 7,846,826 B2 | 12/2010 | Oyu et al. | |
| 7,893,494 B2 | 2/2011 | Chang et al. | |
| 7,893,495 B2 | 2/2011 | Li et al. | |
| 7,947,612 B2 | 5/2011 | Cain | |
| 8,084,331 B2 | 12/2011 | Ofuji et al. | |
| 8,164,138 B2 | 4/2012 | Lee | |
| 8,174,064 B2* | 5/2012 | Jang | H01L 21/84 257/330 |
| 8,325,526 B2 | 12/2012 | Miyazaki et al. | |
| 8,378,341 B2 | 2/2013 | Hayashi et al. | |
| 9,129,937 B2 | 9/2015 | Hayashi et al. | |
| 9,312,394 B2 | 4/2016 | Hayashi et al. | |
| 2001/0046027 A1 | 11/2001 | Tai et al. | |
| 2002/0018357 A1 | 2/2002 | Oguchi et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0109341 A1 | 6/2004 | Oguchi et al. | |
| 2004/0127038 A1 | 7/2004 | Carcia et al. | |
| 2004/0232408 A1 | 11/2004 | Heeger et al. | |
| 2005/0017302 A1 | 1/2005 | Hoffman | |
| 2005/0199959 A1 | 9/2005 | Chiang et al. | |
| 2006/0022242 A1 | 2/2006 | Sugatani et al. | |
| 2006/0035452 A1 | 2/2006 | Carcia et al. | |
| 2006/0043377 A1 | 3/2006 | Hoffman et al. | |
| 2006/0084255 A1 | 4/2006 | Oyu et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0134858 A1 | 6/2006 | Yamazaki | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0007571 A1 | 1/2007 | Lindsay et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0278540 A1 | 12/2007 | Hoshino et al. | |
| 2007/0287296 A1 | 12/2007 | Chang | |
| 2007/0296031 A1 | 12/2007 | Tanaka | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0001436 A1 | 1/2009 | Kondo | |

(56) References Cited

U.S. PATENT DOCUMENTS

| | | |
|---|---|---|
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0256237 A1 | 10/2009 | Kobayashi |
| 2009/0278122 A1 | 11/2009 | Hosono et al. |
| 2009/0280600 A1 | 11/2009 | Hosono et al. |
| 2009/0315138 A1 | 12/2009 | Chang et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0133091 A1 | 6/2010 | Nishio et al. |
| 2010/0159639 A1 | 6/2010 | Sakata |
| 2011/0001186 A1 | 1/2011 | Seo et al. |
| 2011/0092016 A1 | 4/2011 | Ofuji et al. |
| 2012/0025304 A1 | 2/2012 | Blank et al. |
| 2012/0187410 A1 | 7/2012 | Yamazaki et al. |
| 2012/0187417 A1 | 7/2012 | Yamazaki et al. |
| 2012/0223306 A1 | 9/2012 | Saito et al. |
| 2012/0235150 A1 | 9/2012 | Isobe et al. |
| 2016/0211173 A1 | 7/2016 | Hayashi et al. |

FOREIGN PATENT DOCUMENTS

| | | |
|---|---|---|
| CN | 101960571 A | 1/2011 |
| EP | 0531124 A | 3/1993 |
| EP | 1737044 A | 12/2006 |
| EP | 1921681 A | 5/2008 |
| EP | 2136405 A | 12/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 05-297413 A | 11/1993 |
| JP | 06-208796 A | 7/1994 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-026285 A | 1/2002 |
| JP | 2002-076356 A | 3/2002 |
| JP | 2002-289859 A | 10/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-101141 A | 4/2005 |
| JP | 2006-049413 A | 2/2006 |
| JP | 2007-294928 A | 11/2007 |
| JP | 2008-004738 A | 1/2008 |
| JP | 2008-034760 A | 2/2008 |
| JP | 2008-524839 | 7/2008 |
| JP | 2009-016368 A | 1/2009 |
| JP | 2009-021309 A | 1/2009 |
| JP | 2009-021561 A | 1/2009 |
| JP | 2009-135350 A | 6/2009 |
| JP | 2009-167087 A | 7/2009 |
| JP | 2009-212443 A | 9/2009 |
| JP | 2010-141230 A | 6/2010 |
| JP | 2010-166030 A | 7/2010 |
| JP | 2010-258471 A | 11/2010 |
| KR | 2010-0120312 A | 11/2010 |
| WO | WO-2004/114391 | 12/2004 |
| WO | WO-2006/064275 | 6/2006 |
| WO | WO-2009/110623 | 9/2009 |
| WO | WO-2010/071034 | 6/2010 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YBFE2O4, and YB2FE3O7 Types of Structures for Compounds in the In2O3 and Sc2O3-A2O3-Bo Systems [A; Fe, Ga, or Al; B: Mg, Mn, Fe, Ni, Cu, or Zn] At Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al.; "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Sympposium Digest of Technical Papers, 2007, vol. 38, pp. 1830-1833.

(56) References Cited

OTHER PUBLICATIONS

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by PEALD Grown ZNO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTS With a Novel Passivation Layer", SID Digest '09 : SID International Symposium Digest of Techncial Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 : Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using Castep", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J. et al., "Improvements in the Device Characteristics of Amorphous Indium Gallium Zinc Oxide Thin-Film Transistors by Ar Plasma Treatment", Appl. Phys. Lett. (Applied Physics Letters) . Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission

(56) References Cited

OTHER PUBLICATIONS

AM-OLED Display", SID Digest '08 : SID International Symposium Digest of Technical Papers, May 20, 2008, vol. 39, pp. 629-632.

Fung.T et al., "2-D Numerical SiMulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZNO Thin-Film Transistors Produced At Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3 (ZnO)5 films", Appl. Phys. Lett. (Applied Physics Letters) , Sep. 13, 2004, vol. 85, No. 11, pp. 1993-1995.

International Search Report (Application No. PCT/JP2012/051136) Dated Feb. 21, 2012.

Written Opinion (Application No. PCT/JP2012/051136) Dated Feb. 21, 2012.

International Search Report (Application No. PCT/JP2012/051137) Dated Feb. 21, 2012.

Written Opinion (Application No. PCT/JP2012/051137) Dated Feb. 21, 2012.

Taiwanese Office Action (Application No. 105120964) dated Feb. 15, 2017.

\* cited by examiner electric charge of 0 electric charge of +1 electric charge of 0 electric charge of −1 electric charge of 0

FIG. 14A    FIG. 14B
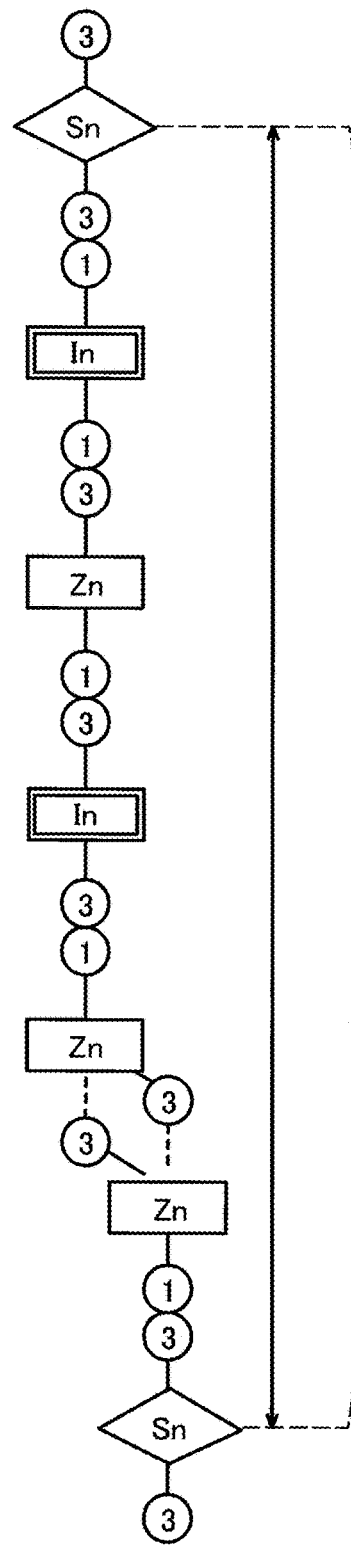
FIG. 14C
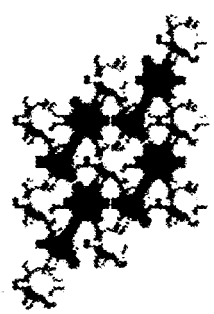
● In
☾ Sn
☾ Zn
● O

SEMICONDUCTOR DEVICE HAVING A WIDE-GAP SEMICONDUCTOR LAYER IN AN INSULATING TRENCH

BACKGROUND OF THE INVENTION

1. Field of the Invention

The present invention relates to a technique for miniaturizing semiconductor integrated circuits. The invention disclosed in this specification includes in its scope an element formed using a compound semiconductor, in addition to that formed using a silicon semiconductor, as a component of a semiconductor integrated circuit, and discloses an element formed using a wide-gap semiconductor as an example.

2. Description of the Related Art

As semiconductor memory devices, dynamic RAMs (DRAMs) are well-known products and currently used in a variety of electronic devices. A memory cell which is a key component in a DRAM includes a read and write transistor and a capacitor.

Circuit patterns for DRAMs, like those for other semiconductor integrated circuits, have been miniaturized in accordance with the scaling law, and there was a time when it was considered difficult to achieve a design rule of 100 nm or less. One of the reasons is that in a transistor having a channel length of 100 nm or less, a punch-through current is likely to flow due to a short-channel effect and the transistor becomes incapable of functioning as a switching element, which has been considered to be a problem. In order to prevent a punch-through current, a silicon substrate may be doped with an impurity at high concentration. However, this is not an appropriate solution to the problem because it makes a junction leakage current likely to flow between a source and the substrate or between a drain and the substrate and eventually causes a deterioration of memory retention characteristics.

Against such a problem, a method has been considered for reducing the area occupied by one memory cell and also maintaining an effective channel length so as not to cause a short-channel effect by forming a three-dimensional transistor in the memory cell. One example is a structure in which a U-shaped vertically long groove is formed in a region where a channel portion of a transistor is formed, a gate insulating film is formed along a wall surface in the groove, and a gate electrode is formed so as to fill the groove (see Reference 1).

A transistor having a channel portion of such a structure has a long effective channel length because a current flows between a source region and a drain region via an indirect route across the groove portion. This provides an advantageous effect of reducing the area occupied by a transistor in a memory cell and suppressing a short-channel effect.

REFERENCE

[Reference 1] Kinam Kim, "Technology for sub-50 nm DRAM and NAND Flash Manufacturing", International Electron Devices Meeting 2005, IEDM Technical Digest, December 2005, pp. 333-336

SUMMARY OF THE INVENTION

However, a conventional DRAM needs to be refreshed at an interval of several tens of milliseconds to hold data, which results in large power consumption. In addition, a transistor therein is frequently turned on and off; thus, deterioration of the transistor is also a problem. These problems become significant as the memory capacity increases and transistor miniaturization advances.

Thus, it is an object of the present invention to provide a technique that can improve data retention characteristics of a semiconductor memory device. Another object is to provide a technique that can reduce power consumption as well as improving data retention characteristics of a semiconductor memory device.

In order to achieve any of the above objects, a circuit, specifically a semiconductor memory device, is formed using a transistor including a wide-gap semiconductor, particularly an insulated gate transistor including a wide-gap semiconductor.

With the use of the transistor including a wide-gap semiconductor, the interval between refresh operations can be longer than that for a conventional DRAM, and power consumption can be reduced. In addition, the number of times a transistor is turned on and off per unit time can be reduced, and therefore, the lifetime of the transistor can be made longer than that in a conventional DRAM.

Even in a transistor including a wide-gap semiconductor layer, a short-channel effect might be caused with the advancement of transistor miniaturization. In view of this, a novel transistor structure including a wide-gap semiconductor layer is proposed.

One embodiment of the present invention is a semiconductor device which includes a first trench and a second trench in an insulating layer, a wide-gap semiconductor layer in contact with a bottom surface and an inner wall surface of the first trench, a gate insulating layer over the wide-gap semiconductor layer, a gate electrode over the gate insulating layer, and an insulating layer filling the second trench, in which the gate insulating layer is over a bottom surface and an inner wall surface of the second trench, and the gate electrode fills the first trench. The first trench is a trench for the gate electrode, and the second trench is a trench for element isolation. Note that an upper surface shape of the first trench is a stripe shape or a rod-like shape, and an upper surface shape of the second trench is a lattice shape, a stripe shape, or a rod-like shape.

In the above structure, the semiconductor device may further include a source electrode or a drain electrode in contact with the wide-gap semiconductor layer.

Examples of the wide-gap semiconductor are oxide semiconductors having a band gap larger than 1.1 eV which is the band gap of silicon (such as an In—Ga—Zn—O-based oxide semiconductor (3.15 eV), an indium tin zinc oxide semiconductor (2.6 eV to 2.8 eV or more), indium oxide (about 3.0 eV), indium tin oxide (about 3.0 eV), indium gallium oxide (about 3.3 eV), indium zinc oxide (about 2.7 eV), tin oxide (about 3.3 eV), and zinc oxide (about 3.37 eV)), GaN (about 3.4 eV), and the like.

The cross-sectional shape of the wide-gap semiconductor layer in the channel-length direction is a shape curved along the cross-sectional shape of the first trench, that is, a U shape. With this structure, as the first trench becomes deeper, the channel length of a transistor increases.

In the transistor having a trench structure disclosed in this specification, the occurrence of a short-channel effect can be suppressed by appropriately setting the depth of the first trench even when the distance between the source electrode and the drain electrode is decreased.

Improvement of data retention characteristics of a semiconductor memory device can be achieved. A reduction of power consumption as well as improvement of data retention characteristics of a semiconductor memory device can be achieved.

BRIEF DESCRIPTION OF THE DRAWINGS

FIGS. 14A to 14C illustrate a structure of an oxide material according to one embodiment of the present invention.

DETAILED DESCRIPTION OF THE INVENTION

Embodiments of the present invention will be described in detail below with reference to drawings. Note that the present invention is not limited to the description below, and it is easily understood by those skilled in the art that modes and details of the present invention can be modified in various ways. In addition, the present invention should not be construed as being limited to the description in the embodiments given below.

Embodiment 1

Figure 1A:
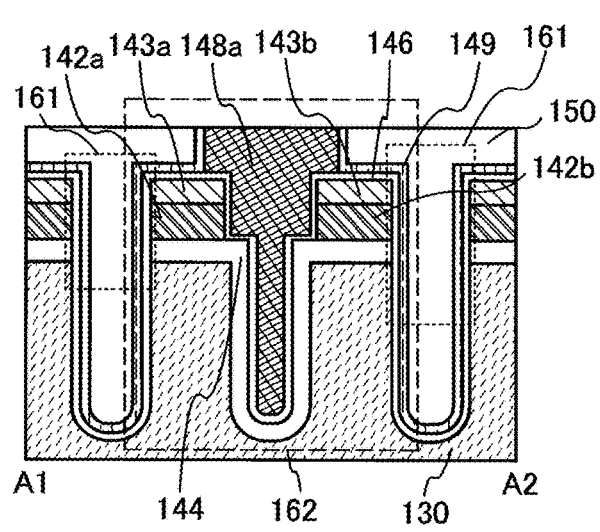
FIGS. 1A to 1C are cross-sectional views and a top view of one embodiment of the present invention.
Figure 1B:
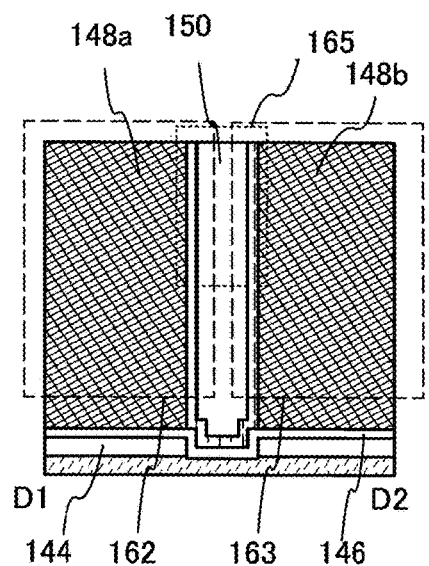
Figure 1C:
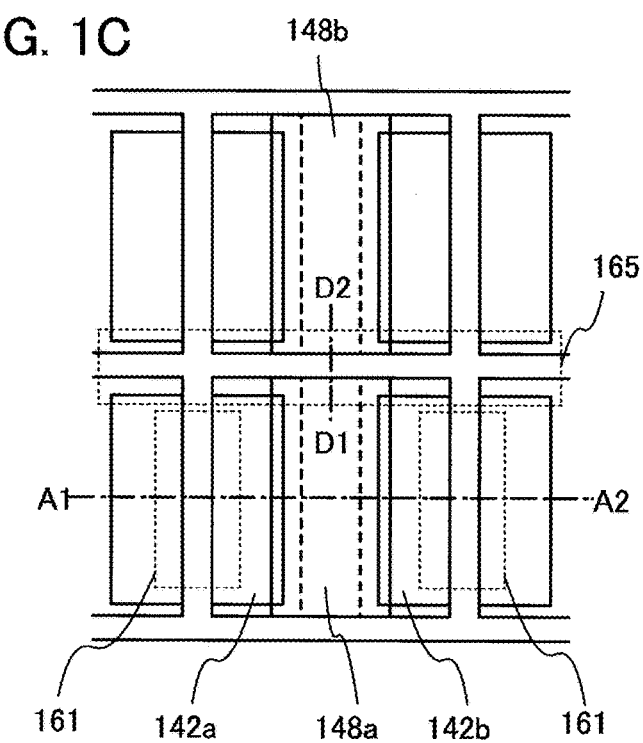

In this embodiment, a structure of a transistor and a method for manufacturing the transistor according to one embodiment of the present invention will be described with reference to FIGS. 1A to 1C. FIG. 1A is an example of a cross-sectional view of a transistor 162 in a channel-length direction. FIG. 1B is an example of a cross-sectional view of an element isolation region 165 between the transistor 162 and a transistor 163. FIG. 1C is an example of a top view of the transistor 162 and the transistor 163. Note that FIG. 1B is part of a cross-sectional view of the transistor 162 in a channel-width direction, and corresponds to a cross-sectional view taken along a dotted line D1-D2 in FIG. 1C. FIG. 1A corresponds to a cross-sectional view taken along a dotted line A1-A2 in FIG. 1C.

First, an insulating layer 130 is formed with an oxide film over a semiconductor substrate. Then, a plurality of trenches (also referred to as grooves) is formed in the insulating layer 130. Then, a wide-gap semiconductor layer 144 is formed so as to cover the trenches. The trenches can be formed using a known technique; in this embodiment, trenches having a depth of approximately 0.4 μm are formed. In addition, the trenches for gate electrodes are formed in a single etching step or through a plurality of etching steps.

As the semiconductor substrate, an SOI substrate, a semiconductor substrate provided with a driver circuit including a transistor with a MOSFET structure, a semiconductor substrate provided with a capacitor, or the like is used.

The insulating layer 130 can be formed using a silicon oxide film, a gallium oxide film, an aluminum oxide film, a silicon nitride film, a silicon oxynitride film, an aluminum oxynitride film, or a silicon nitride oxide film.

The wide-gap semiconductor layer 144 can have a thickness of 1 nm to 100 nm and can be formed by a sputtering method, a molecular beam epitaxy (MBE) method, a CVD method, a pulse laser deposition method, an atomic layer deposition (ALD) method, a coating method, a printing method, or the like as appropriate. The wide-gap semiconductor layer 144 may be formed using a sputtering apparatus which performs film formation with surfaces of a plurality of substrates set substantially perpendicular to a surface of a sputtering target, which is so called a columnar plasma (CP) sputtering system.

As a material of the wide-gap semiconductor layer 144, an oxide semiconductor having a wider band gap than at least silicon, gallium nitride, gallium oxynitride, or gallium zinc oxynitride is used. As the oxide semiconductor having a wider band gap than silicon, at least indium (In) or zinc (Zn) is preferably contained. In particular, In and Zn are preferably contained. As a stabilizer for reducing changes in electrical characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main components and there is no limitation on the ratio of In:Ga:Zn. Further, a metal element in addition to In, Ga, and Zn may be contained.

Alternatively, a material represented by $InMO_3(ZnO)_m$ (m>0, where m is not an integer) may be used as the oxide semiconductor. Note that M represents one or more metal elements selected from Ga, Fe, Mn, and Co. Alternatively, a material represented by $In_3SnO_5(ZnO)_n$ (n>0, where n is an integer) may be used as the oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

Further, an In—Sn—Zn-based oxide can be referred to as ITZO (registered trademark), and as a target, an oxide target having a composition ratio of In:Sn:Zn=1:2:2, 2:1:3, 1:1:1, 20:45:35, or the like in an atomic ratio is used.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set as appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a crystalline portion or a non-amorphous structure.

An amorphous oxide semiconductor can have a flat surface with relative ease; therefore, when a transistor is manufactured with the use of the oxide semiconductor, interface scattering can be reduced, and relatively high mobility can be obtained with relative ease.

In this embodiment, an oxide including a crystal with c-axis alignment, which has a triangular or hexagonal atomic arrangement when seen from the direction of an a-b plane, a surface, or an interface, will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis). Such a crystal is also referred to as a c-axis aligned crystal (CAAC).

An oxide including CAAC means, in a broad sense, a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 13A to 13E, FIGS. 14A to 14C, and FIGS. 15A to 15C. In FIGS. 13A to 13E, FIGS. 14A to 14C, and FIGS. 15A to 15C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 13A to 13E, O surrounded by a circle represents tetracoordinate O and O surrounded by a double circle represents tricoordinate O.

Figure 13A:
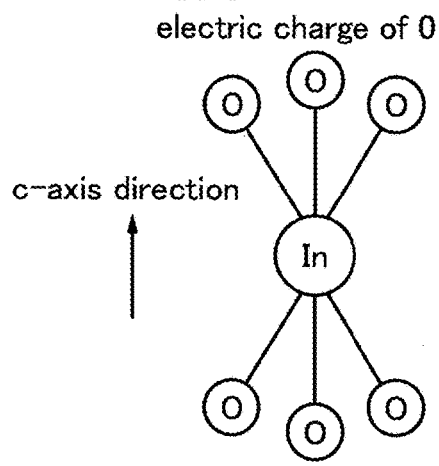
FIGS. 13A to 13E illustrate structures of oxide materials according to one embodiment of the present invention.

FIG. 13A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 13A is actually an octahedral structure, but is illustrated as a planar structure for simplicity. Note that three tetracoordinate O atoms exist in each of an upper half and a lower half in FIG. 13A. In the small group illustrated in FIG. 13A, electric charge is 0.

Figure 13D:
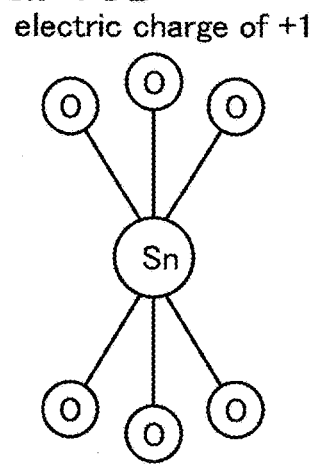
Figure 13B:
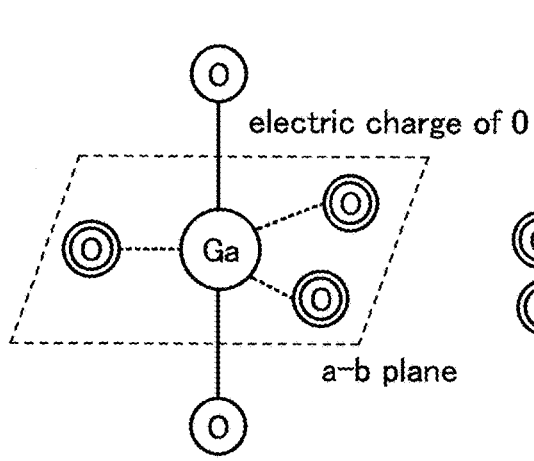

FIG. 13B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 13B. An In atom can also have the structure illustrated in FIG. 13B because an In atom can have five ligands. In the small group illustrated in FIG. 13B, electric charge is 0.

Figure 13E:
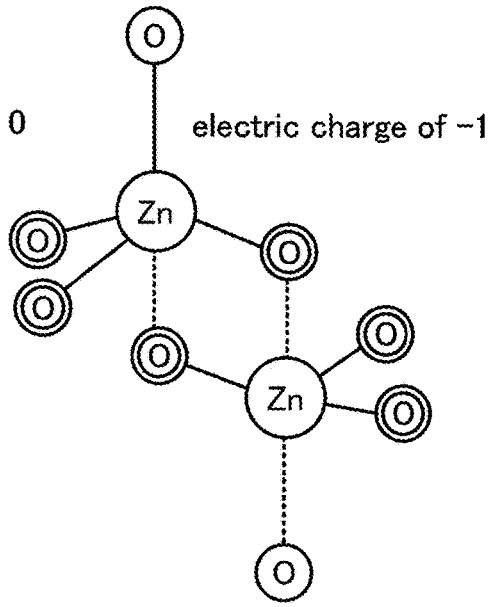
Figure 13C:
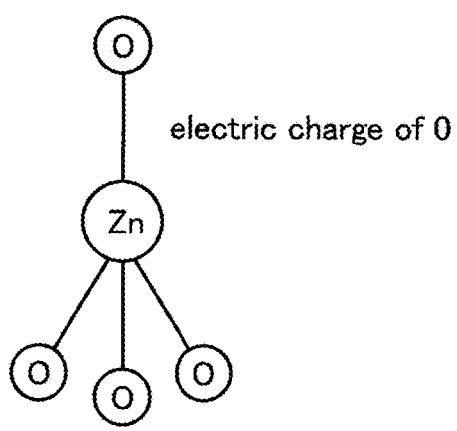

FIG. 13C illustrates a structure including one tetracoordinate Zn atom and four tetracoordinate O atoms proximate to the Zn atom. In FIG. 13C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 13C. In the small group illustrated in FIG. 13C, electric charge is 0.

FIG. 13D illustrates a structure including one hexacoordinate Sn atom and six tetracoordinate O atoms proximate to the Sn atom. In FIG. 13D, three tetracoordinate O atoms exist in each of an upper half and a lower half. In the small group illustrated in FIG. 13D, electric charge is +1.

FIG. 13E illustrates a small group including two Zn atoms. In FIG. 13E, one tetracoordinate O atom exists in each of an upper half and a lower half. In the small group illustrated in FIG. 13E, electric charge is −1.

Here, a plurality of small groups forms a medium group, and a plurality of medium groups forms a large group (also referred to as a unit cell).

Now, a rule of bonding between the small groups will be described. The three O atoms in the upper half with respect to the hexacoordinate In atom in FIG. 13A each have three proximate In atoms in the downward direction, and the three O atoms in the lower half each have three proximate In atoms in the upward direction. The one O atom in the upper half with respect to the pentacoordinate Ga atom in FIG. 13B has one proximate Ga atom in the downward direction, and the one O atom in the lower half has one proximate Ga atom in the upward direction. The one O atom in the upper half with respect to the tetracoordinate Zn atom in FIG. 13C has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 14A illustrates a model of a medium group included in a layered structure of an In—Sn—Zn—O-based material. FIG. 14B illustrates a large group including three medium groups. Note that FIG. 14C illustrates an atomic arrangement in the case where the layered structure in FIG. 14B is observed from the c-axis direction.

In FIG. 14A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 14A, one tetracoordinate O atom existing in each of an upper half and a lower half with respect to an In atom is denoted by circled 1. FIG. 14A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 14A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 13E can be given. For example, with one small group including two Zn atoms, electric charge of one small group including a Sn atom can be cancelled, so that the total electric charge of the layered structure can be 0.

When the large group illustrated in FIG. 14B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figures 15A, 15B, 15C:
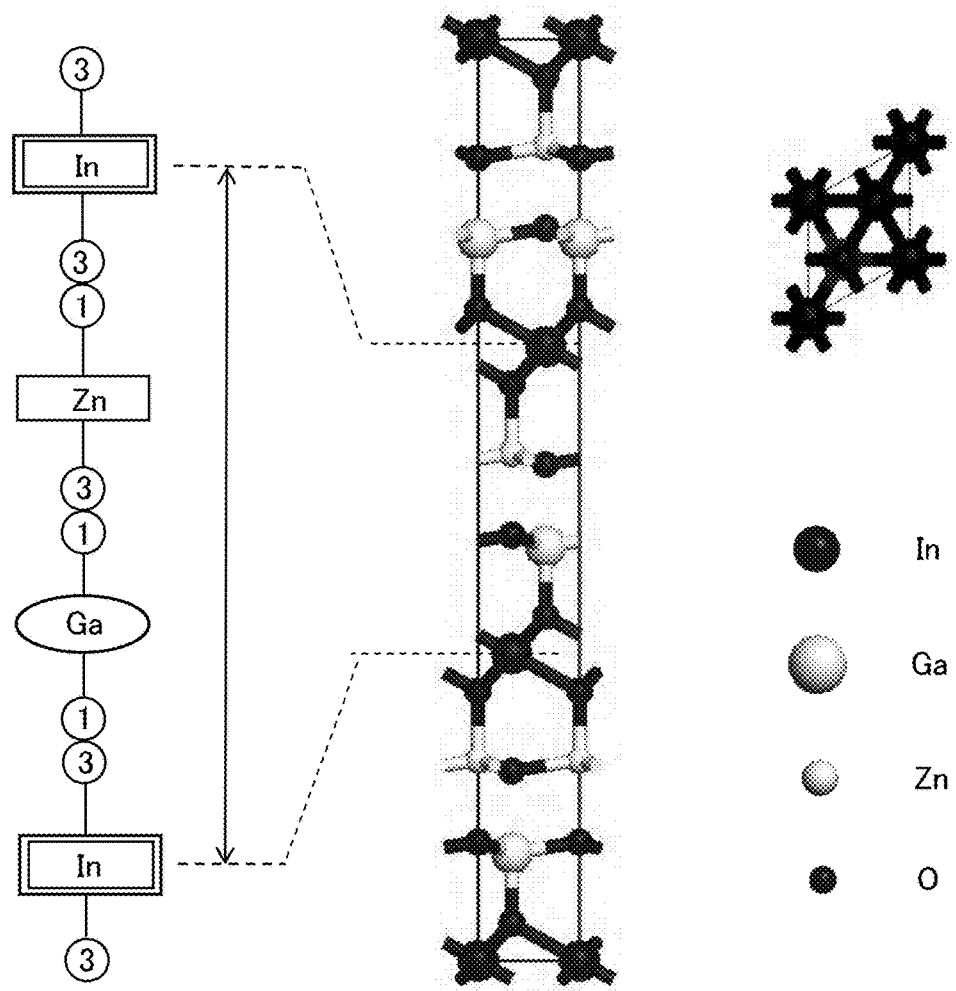
FIGS. 15A to 15C illustrate a structure of an oxide material according to one embodiment of the present invention.

As an example, FIG. 15A illustrates a model of a medium group included in a layered structure of an In—Ga—Zn—O-based material.

In the medium group included in the layered structure of the In—Ga—Zn—O-based material in FIG. 15A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 15B illustrates a large group including three medium groups. Note that FIG. 15C illustrates an atomic arrangement in the case where the layered structure in FIG. 15B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 15A but also a medium group in which the arrangement of the In atom, the Ga atom, and the Zn atom is different from that in FIG. 15A.

Next, electrodes 142a and 142b each of which functions as a source electrode or a drain electrode are formed in contact with the wide-gap semiconductor layer 144. The electrodes 142a and 142b can be formed using a metal material such as molybdenum, titanium, tantalum, tungsten, aluminum, copper, chromium, neodymium, or scandium or an alloy material which contains any of these materials as its main component.

In the case where GaN is used for the wide-gap semiconductor layer 144, titanium or the like is used as a material of the electrodes 142a and 142b each functioning as a source electrode or a drain electrode, and aluminum gallium nitride (AlGaN) is used for a buffer layer for forming a two-dimensional electron gas between the electrodes 142a and 142b and the wide-gap semiconductor layer 144.

In addition, insulating layers 143a and 143b are formed in order to protect the electrodes 142a and 142b. Next, planarization treatment is performed using chemical mechanical polishing (CMP) or the like. In this planarization treatment, the insulating layers 143a and 143b function as buffer layers for preventing the electrodes 142a and 142b from being removed.

Next, trenches for element isolation in the channel-length direction and trenches for element isolation in the channel-width direction are formed. These trenches for element isolation may have a continuous upper surface pattern shape or separate upper surface pattern shapes. In this embodiment, division of the wide-gap semiconductor layer is achieved by formation of the trenches; thus, these trenches have a continuous upper surface pattern shape (a lattice shape) in FIG. 1C. During the formation of the trenches for element isolation in the channel-width direction, division into the electrode 142a and the electrode 142b can also be achieved. Note that the timing of formation of the trenches for element isolation is not particularly limited. In addition, the depth of the trenches for element isolation is not limited to a depth at which the horizontal position of the bottoms thereof is the same as that of the bottoms of the trenches for the gate electrodes, as long as sufficient element isolation can be achieved. Element isolation can be ensured by setting the horizontal position of the bottoms of the trenches for element isolation to be deeper than that of the bottoms of the trenches for the gate electrodes.

Then, a gate insulating layer 146 is formed so as to cover part of the wide-gap semiconductor layer 144, the electrodes 142a and 142b each functioning as a source electrode or a drain electrode, and the insulating layers 143a and 143b. The gate insulating layer 146 is also formed on the inner walls and bottoms of the trenches for element isolation in the channel-length direction and the inner walls and bottoms of the trenches for element isolation in the channel-width direction.

The gate insulating layer 146 can have a thickness of 1 nm to 100 nm and can be formed by a sputtering method, an MBE method, a CVD method, a pulse laser deposition method, an ALD method, a coating method, a printing method, or the like as appropriate. The gate insulating layer 146 may be formed using a sputtering apparatus which performs film formation with surfaces of a plurality of substrates set substantially perpendicular to a surface of a sputtering target, which is so called a columnar plasma (CP) sputtering system.

The gate insulating layer 146 can be formed using a silicon oxide film, a gallium oxide film, an aluminum oxide film, a silicon nitride film, a silicon oxynitride film, an aluminum oxynitride film, or a silicon nitride oxide film. Further, the gate insulating layer 146 is preferably formed in consideration of the size of a transistor to be formed and the step coverage with the gate insulating layer 146. In this embodiment, a silicon oxide film of $SiO_{2+\alpha}$ ($\alpha$>0) is used as the gate insulating layer 146. By using the silicon oxide film as the gate insulating layer 146, oxygen can be supplied to the In—Ga—Zn—O-based oxide semiconductor and favorable characteristics can be obtained.

When the gate insulating layer 146 is formed using a high-k material such as hafnium oxide, yttrium oxide, hafnium silicate ($HfSi_xO_y$ (x>0, y>0)), hafnium silicate to which nitrogen is added ($HfSi_xO_yN_z$ (x>0, y>0, z>0)), or hafnium aluminate ($HfAl_xO_y$ (x>0, y>0)), gate leakage current can be reduced. Further, the gate insulating layer 146 may have a single-layer structure or a stacked structure.

Then, a gate electrode 148a is formed over the gate insulating layer 146 so as to fill the trench for the gate electrode. The gate electrode 148a can be formed using a metal material such as molybdenum, titanium, tantalum, tungsten, aluminum, copper, chromium, neodymium, or scandium or an alloy material which contains any of these materials as its main component. The gate electrode 148a may have a single-layer structure or a stacked structure.

As one layer of the gate electrode 148a which is in contact with the gate insulating layer 146, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film is used. These films each have a work function of 5 eV or higher, preferably 5.5 eV or higher, which enables the threshold voltage of the transistor to be positive when used as the gate electrode. Accordingly, a so-called normally off switching element can be provided.

When the gate electrode 148a is formed in the trench for the gate electrode, the transistor 162 with a trench structure is formed.

Then, an insulating layer 149 is formed so as to cover the gate electrode 148a and a gate electrode 148b. As the insulating layer 149, an insulating film providing favorable step coverage is preferably used. The insulating layer 149 can be formed using a silicon oxide film, a gallium oxide film, an aluminum oxide film, a silicon nitride film, a silicon oxynitride film, an aluminum oxynitride film, or a silicon nitride oxide film. In this embodiment, an aluminum oxide film is used as the insulating layer 149. In FIGS. 1A and 1B, the gate insulating layer 146 is formed in contact with a side surface of the wide-gap semiconductor layer 144, and furthermore, the insulating layer 149 is formed. Accordingly, in this embodiment, a silicon oxide film of $SiO_{2+\alpha}$ ($\alpha>0$) covers a side surface of the wide-gap semiconductor layer 144 and an aluminum oxide film covers the silicon oxide film, thereby blocking oxygen so as not to be diffused from the silicon oxide film and pass through the insulating layer 149.

After the insulating layer 149 is formed, an insulating layer 150 for filling the trenches for element isolation is formed by a CVD method or the like. By filling the trenches for element isolation with the insulating layer 150, element isolation regions 161 and 165 are formed. Note that when the gate insulating layer 146 and the insulating layer 149 are stacked in the trenches for element isolation before the insulating layer 150 is formed, regions to be filled with the insulating layer 150 can be smaller and can be smoothly filled with the insulating layer 150. After that, planarization treatment is performed using CMP or the like, whereby the structure illustrated in FIGS. 1A and 1B can be obtained.

As illustrated in FIG. 1B, a space between the gate electrode 148a of the transistor 162 and the gate electrode 148b of the transistor 163 adjacent thereto is also filled with the insulating layer 150, which makes it possible to prevent a short-circuit between the gate electrodes. Furthermore, as illustrated in FIG. 1A, a space between the electrode which functions as a source electrode or a drain electrode of the transistor 162 and an electrode which functions as a source electrode or a drain electrode of a transistor adjacent thereto in the channel-length direction is also filled with the insulating layer 150, which makes it possible to prevent a short-circuit between these electrodes.

In this embodiment, the wide-gap semiconductor layer 144 is formed in contact with the inner wall of the trench of 0.4 μm; thus, the channel length is approximately 0.8 μm or more. In the case where an In—Ga—Zn—O-based oxide semiconductor is used as the wide-gap semiconductor layer 144, a transistor with a channel length of 0.8 μm or more can be a normally off transistor, and the occurrence of short-channel effect can be prevented. In addition, by employing the trench structure, a reduction in the planar area of a transistor can be achieved, so that higher integration can be achieved.

Embodiment 2

Figure 2A:
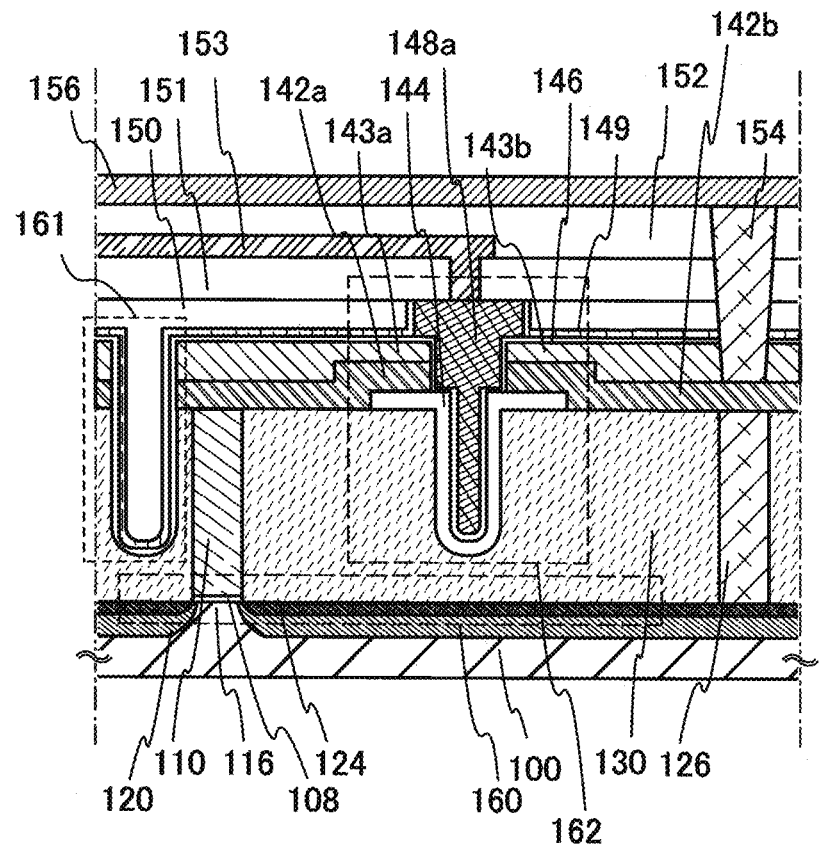
FIGS. 2A and 2B are a cross-sectional view and a circuit diagram of one embodiment of the present invention.
Figure 2B:
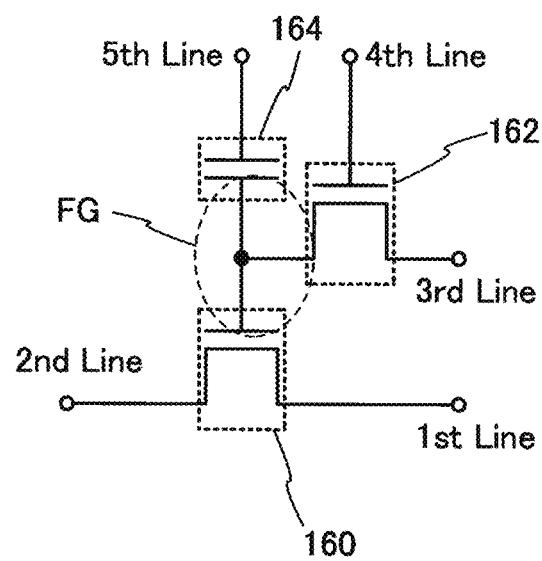

FIGS. 2A and 2B illustrate an example of a semiconductor device which includes the transistor 162 illustrated in FIGS. 1A to 1C, which can hold stored data even when not powered, and which has an unlimited number of write cycles.

Since the off-state current of the transistor 162 is small, stored data can be held for a long time owing to such a transistor. In other words, the frequency of refresh operation can be extremely lowered, which leads to a sufficient reduction in power consumption.

FIG. 2A illustrates an example of a cross section of the semiconductor device.

The semiconductor device illustrated in FIG. 2A includes a transistor 160 including a first semiconductor material in a lower portion, and a transistor 162 including a second semiconductor material in an upper portion. The transistor 162 is the same as that in Embodiment 1; thus, for description of FIGS. 2A and 2B, the same reference numerals are used for the same parts as those in FIG. 1A.

Here, the first semiconductor material and the second semiconductor material are preferably materials having different band gaps. For example, the first semiconductor material can be a semiconductor material (such as silicon) other than an oxide semiconductor, and the second semiconductor material can be an oxide semiconductor. A transistor including a material other than an oxide semiconductor can operate at high speed easily. On the other hand, a transistor including an oxide semiconductor can hold electric charge for a long time owing to its characteristics.

Although both of the above transistors are n-channel transistors in the following description, it is needless to say that p-channel transistors can be used. The technical nature of the disclosed invention is to use a wide-gap semiconductor in the transistor 162 so that data can be held. Therefore, it is not necessary to limit a specific structure of the semiconductor device, such as a material of the semiconductor device or a structure of the semiconductor device, to the structure described here.

The transistor 160 in FIG. 2A includes a channel formation region 116 provided in a substrate 100 including a semiconductor material (such as silicon), impurity regions 120 provided such that the channel formation region 116 is sandwiched therebetween, metal compound regions 124 provided in contact with the impurity regions 120, a gate insulating layer 108 provided over the channel formation region 116, and a gate electrode 110 provided over the gate insulating layer 108.

An electrode 126 is connected to part of the metal compound region 124 of the transistor 160. Here, the electrode 126 functions as a source electrode or a drain electrode of the transistor 160. Further, an element isolation insulating layer is formed on the substrate 100 so as to surround the transistor 160, and an insulating layer 130 is formed so as to cover the transistor 160. Note that for higher integration, it is preferable that, as in FIG. 2A, the transistor 160 does not have a sidewall insulating layer. On the other hand, when the characteristics of the transistor 160 have priority, the sidewall insulating layer may be formed on a side surface of the gate electrode 110 and the impurity regions 120 may include a region having a different impurity concentration.

As illustrated in FIG. 2A, the transistor 162 includes the wide-gap semiconductor layer 144 and has a trench structure.

Here, the wide-gap semiconductor layer 144 is preferably a purified wide-gap semiconductor layer. By using a purified wide-gap semiconductor, the transistor 162 which has extremely favorable electrical characteristics can be obtained.

Note that for the transistor 162 in FIG. 2A, an element isolation region 161 is provided in order to suppress leakage between elements due to miniaturization. Furthermore, the wide-gap semiconductor layer 144 which is processed in an island shape and smaller than a region surrounded by the element isolation region 161 is used; however, as described in Embodiment 1, a structure in which the wide-gap semiconductor layer 144 is not processed into an island shape until trenches for element isolation are formed may be employed. When the wide-gap semiconductor layer 144 is not processed into an island shape, the wide-gap semiconductor layer 144 can be prevented from being contaminated by etching during processing. It is needless to say that the number of steps can be reduced in the case where the wide-gap semiconductor layer 144 is not processed into an island shape. In the case of using the wide-gap semiconductor layer 144 which is processed in an island shape and smaller than the region surrounded by the element isolation region 161, there is no need to divide the wide-gap semiconductor layer by formation of trenches for element isolation, and thus, the horizontal position of the bottoms of the trenches for element isolation can be shallower than that of the bottoms of trenches for gate electrodes, or the total area of the trenches for element isolation can be reduced.

An insulating layer 151 is provided over the transistor 162, and an electrode 153 which is electrically connected to the gate electrode 148a is provided over the insulating layer 151. In addition, an insulating layer 152 is provided over the electrode 153. An electrode 154 is provided in an opening formed in the gate insulating layer 146, the insulating layer 150, the insulating layer 151, the insulating layer 152, and the like, and a wiring 156 which is connected to the electrode 154 is formed over the insulating layer 152. Note that although the metal compound region 124, the electrode 142b, and the wiring 156 are connected to one another through the electrode 126 and the electrode 154 in FIG. 2A, the disclosed invention is not limited thereto. For example, the electrode 142b may be in direct contact with the metal compound region 124. Alternatively, the wiring 156 may be in direct contact with the electrode 142b.

Next, an example of a circuit configuration corresponding to FIG. 2A is illustrated in FIG. 2B.

In FIG. 2B, a first wiring (1st Line) is electrically connected to a source electrode of the transistor 160. A second wiring (2nd Line) is electrically connected to a drain electrode of the transistor 160. A third wiring (3rd Line) is electrically connected to one of a source and a drain electrodes of the transistor 162, and a fourth wiring (4th Line) is electrically connected to a gate electrode of the transistor 162. A gate electrode of the transistor 160 and the other of the source and drain electrodes of the transistor 162 are electrically connected to one electrode of a capacitor 164. A fifth wiring (5th Line) is electrically connected to the other electrode of the capacitor 164.

The capacitor 164 can be formed with a pair of electrodes and an insulating layer interposed therebetween and serving as a dielectric, through the same process as the process for manufacturing the transistor 160 and the transistor 162. Note that the present invention is not limited to formation of the capacitor 164 through the same process as the process for manufacturing the transistor 160 and the transistor 162, and layers of the capacitor 164 may be separately provided above the transistor 162. For example, a trench-type capacitor or a stack-type capacitor may be separately formed above the transistor 162 or below the transistor 160 so as to be three-dimensionally stacked, whereby the degree of integration may be increased.

The semiconductor device in FIG. 2B utilizes a characteristic in which the potential of the gate electrode of the transistor 160 can be held, and thus enables data writing, holding, and reading as follows.

Writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and to the capacitor 164. That is, predetermined charge is supplied to the gate electrode of the transistor 160 (writing). Here, one of two kinds of charges providing different potentials (hereinafter referred to as a low-level charge and a high-level charge) is applied. After that, the potential of the fourth wiring is set to a potential at which the transistor 162 is turned off, so that the transistor 162 is turned off. Thus, the charge supplied to the gate electrode of the transistor 160 is held (holding).

In addition, a back gate electrode may be provided, and it is preferable that the transistor 162 be surely a normally off transistor by application of the voltage to the back gate electrode.

This embodiment can be freely combined with Embodiment 1.

Embodiment 3

In this embodiment, a semiconductor device which includes the transistor 162 illustrated in FIGS. 1A to 1C, which can hold stored data even when not powered, which has an unlimited number of write cycles, and which has a structure different from the structure described in Embodiment 2 will be described with reference to FIG. 3.

Figure 3:
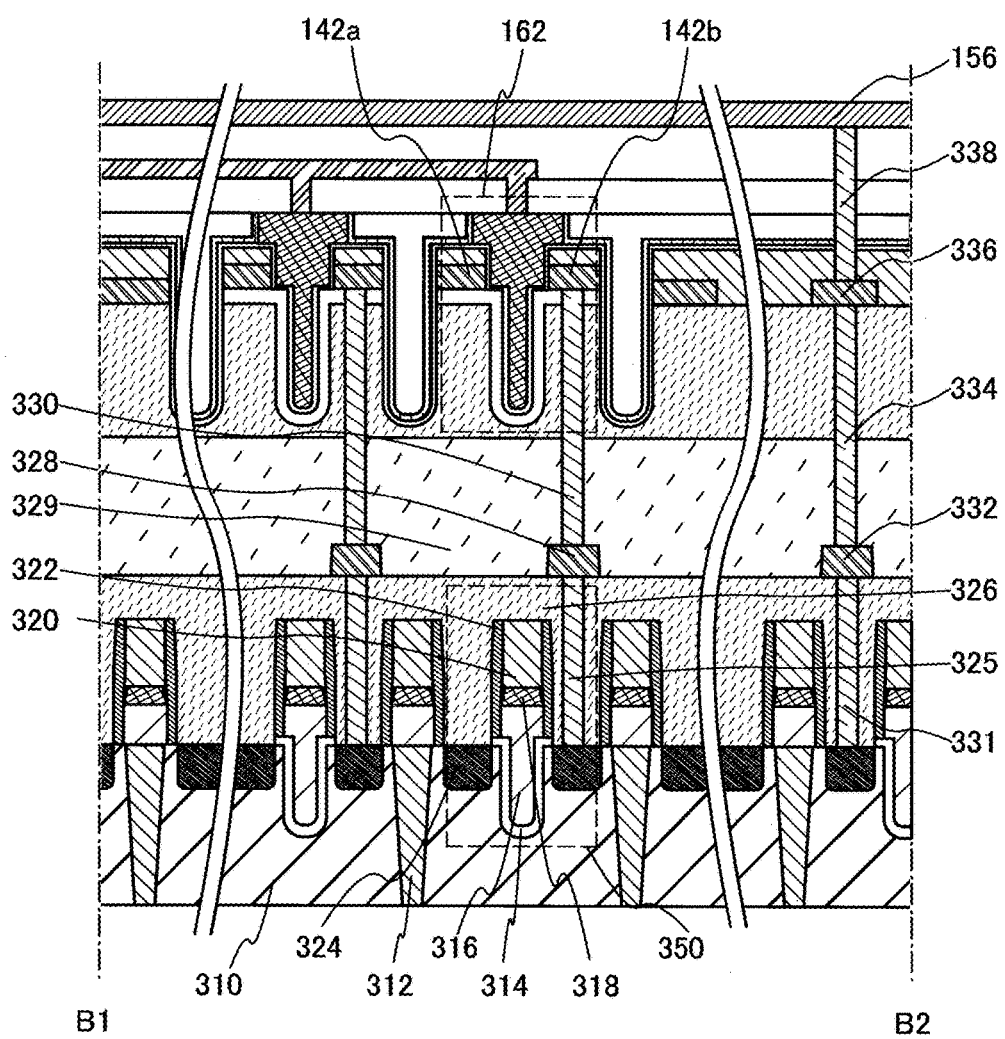
FIG. 3 is a cross-sectional view of one embodiment of the present invention.

The semiconductor device illustrated in FIG. 3 includes a transistor 350 including a first semiconductor material in a lower portion, and a transistor 162 including a second semiconductor material in an upper portion. Although a plurality of transistors is formed using semiconductor materials in the upper and lower portions, the transistor 350 and the transistor 162 will be typically described. Note that FIG. 3 which is taken along line B1-B2 corresponds to a cross-sectional view perpendicular to the channel-length direction of transistors.

Here, the first semiconductor material and the second semiconductor material are preferably materials having different band gaps. For example, the first semiconductor material can be a semiconductor material (such as silicon) other than an oxide semiconductor, and the second semiconductor material can be an oxide semiconductor. A transistor including a material other than an oxide semiconductor can operate at high speed easily. On the other hand, a transistor including an oxide semiconductor can hold electric charge for a long time owing to its characteristics.

The transistor 162 including the second semiconductor material in the upper portion is the same as the transistor 162 described in Embodiments 1 and 2; thus, for description of FIG. 3, the same reference numerals are used for the same parts as those in FIG. 1A.

The transistor 350 formed using the first semiconductor material in the lower portion will be described below.

The transistor 350 includes a semiconductor substrate 310, a gate insulating layer 314, a semiconductor layer 316, a conductive layer 318, a protective insulating layer 320, a sidewall insulating layer 322, impurity regions 324, and an insulating layer 326. Note that the semiconductor layer 316 and the conductive layer 318 function as a gate electrode, and the impurity regions 324 each function as a source region or a drain region.

In addition, the transistor 350 is adjacently provided with shallow trench isolation (STI) regions 312.

The STI regions 312 can be formed as follows: first, trenches (also referred to as grooves) are formed by forming a protective insulating film in a desired region over the semiconductor substrate 310 and performing etching; then, after the formation of the trenches, the trenches are filled with an insulating dielectric film. As the insulating dielectric film, a silicon oxide film, a silicon nitride film, or the like can be used.

Next, the transistor 350 will be described in detail. The gate insulating layer 314 of the transistor 350 can be formed as follows. An insulating film is formed over the semiconductor substrate 310 provided with the STI regions 312, and then, patterning and etching are performed in a desired position, whereby a trench having a depth different from that of the STI regions 312 is formed in the semiconductor substrate 310. After that, heat treatment is performed in an oxygen atmosphere, whereby the semiconductor substrate 310 in the trench is oxidized. In this manner, the gate insulating layer 314 can be formed.

After the gate insulating layer 314 is formed, a silicon film is formed using an LPCVD method or the like. Note that the silicon film is subjected to $n^+$ or $p^+$ doping treatment, heat treatment, or the like so as to obtain a polysilicon film, whereby a highly conductive semiconductor layer is formed. After that, a metal film is formed over the semiconductor layer by a sputtering method or the like. As the metal film, tungsten, titanium, cobalt, or nickel or an alloy film, a metal nitride film, a silicide film, or the like containing tungsten, titanium, cobalt, or nickel can be used. Patterning is performed on a desired region over the metal film, and etching is performed, whereby the conductive layer 318 is formed. In addition, the semiconductor layer is etched using the conductive layer 318 as a mask, whereby the semiconductor layer 316 can be formed. Note that the conductive layer 318 and the semiconductor layer 316 function as a gate electrode of the transistor 350.

Next, the protective insulating layer 320 is formed over the conductive layer 318. The protective insulating layer 320 can be formed in such a manner that a silicon oxide film, a silicon nitride film, or the like is formed using a plasma CVD method or the like and patterning and etching treatments are performed on a desired region.

Next, a silicon nitride film is formed using a plasma CVD method or the like so as to cover the semiconductor substrate 310 and the protective insulating layer 320 and is etched back, whereby the sidewall insulating layer 322 can be formed.

Next, the impurity regions 324 are formed by performing doping treatment using the protective insulating layer 320 and the sidewall insulating layer 322 as a mask. Note that as a dopant, boron, phosphorus, or the like may be used, and as the impurity regions 324, $n^+$ regions, $p^+$ regions, or the like can be formed as appropriate depending on the dopant used. Note that the impurity regions 324 each function as a source region or a drain region of the transistor 350.

Next, the insulating layer 326 is formed so as to cover the impurity regions 324, the protective insulating layer 320, and the sidewall insulating layer 322. The insulating layer 326 can be formed using a silicon oxide film or the like by a plasma CVD method or the like.

Next, openings are provided in desired regions of the insulating layer 326, and a connection electrode 325 and a connection electrode 331 are formed so as to be electrically connected to the impurity regions 324. Note that after the connection electrode 325 and the connection electrode 331 are formed, CMP treatment or the like may be performed to planarize surfaces of the insulating layer 326, the connection electrode 325, and the connection electrode 331.

Next, a conductive film is formed using a sputtering method or the like over the insulating layer 326, the connection electrode 325, and the connection electrode 331, and patterning and etching are performed on a desired region, whereby an electrode 328 and an electrode 332 are formed. As a material of the electrode 328 and the electrode 332, tungsten, copper, titanium, or the like can be used as appropriate.

Next, an insulating layer 329 is formed over the insulating layer 326, the electrode 328, and the electrode 332. The insulating layer 329 can be formed using a material and a method similar to those for the insulating layer 326.

Through the above-described process, the semiconductor material 310 provided with the transistor 350 formed using a first semiconductor substrate can be formed.

Here, connections between the transistor 350 including the first semiconductor material in the lower portion and the transistor 162 including the second semiconductor material in the upper portion will be described below.

The transistor 350 is electrically connected to the transistor 162 through the impurity region 324, the connection electrode 325, the electrode 328, and a connection electrode 330. On the other hand, another transistor 350 is electrically connected to the wiring 156 through the impurity region 324, the connection electrode 331, the electrode 332, a connection electrode 334, an electrode 336, and a connection electrode 338.

In addition, the gate electrode of the transistor 350 (i.e., the semiconductor layer 316 and the conductive layer 318) is electrically connected to a source electrode of the transistor 162. Note that the connection between the gate electrode of the transistor 350 and the source electrode of the transistor 162 is not illustrated in FIG. 3, and the connection is established in a three-dimensional direction.

As described above, the plurality of memory cells is formed in the upper portion with the transistors including an oxide semiconductor which is one of wide-gap semiconductors. Since the off-state current of the transistor including an oxide semiconductor is small, stored data can be held for a long time owing to such a transistor. In other words, the frequency of refresh operation can be extremely lowered, which leads to a sufficient reduction in power consumption. On the other hand, for the peripheral circuit, a semiconductor material other than the oxide semiconductor is used. The semiconductor material other than the oxide semiconductor may be, for example, silicon, germanium, silicon germanium, silicon carbide, gallium arsenide, or the like and is preferably a single crystal semiconductor. A transistor including such a semiconductor material can operate at sufficiently high speed. Therefore, the transistor including the material other than the oxide semiconductor can favorably realize a variety of circuits (e.g., a logic circuit or a driver circuit) which needs to operate at high speed.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

This embodiment can be implemented in appropriate combinations with the configurations described in the other embodiments.

Embodiment 4

In this embodiment, a semiconductor device which includes the transistor 162 illustrated in FIGS. 1A to 1C, which can hold stored data even when not powered, which has an unlimited number of write cycles, and which has a structure different from the structures described in Embodiments 2 and 3 will be described with reference to FIGS. 4A and 4B and FIG. 5.

Figure 4A:
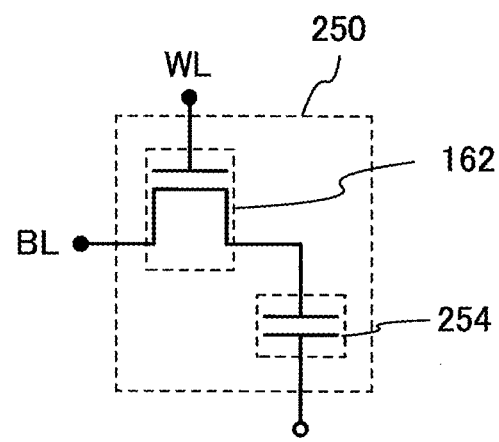
FIGS. 4A and 4B are a circuit diagram and a conceptual diagram of a semiconductor device of one embodiment of the present invention.
Figure 4B:
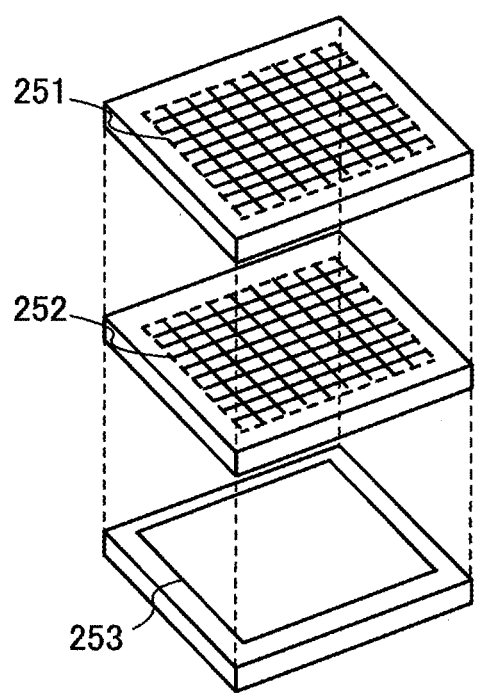

FIG. 4A illustrates an example of a circuit configuration of a semiconductor device, and FIG. 4B is a conceptual diagram illustrating an example of a semiconductor device. First, the semiconductor device illustrated in FIG. 4A will be described, and then, the semiconductor device illustrated in FIG. 4B will be described.

In the semiconductor device illustrated in FIG. 4A, a bit line BL is electrically connected to a source electrode or a drain electrode of the transistor 162, a word line WL is electrically connected to a gate electrode of the transistor 162, and a source electrode or a drain electrode of the transistor 162 is electrically connected to a first terminal of a capacitor 254.

The transistor 162 including an oxide semiconductor as a wide-gap semiconductor has a characteristic of a significantly small off-state current. For that reason, a potential of the first terminal of the capacitor 254 (or a charge accumulated in the capacitor 254) can be held for an extremely long period by turning off the transistor 162. Further, in the transistor 162 including an oxide semiconductor as a wide-gap semiconductor, a short-channel effect is not likely to be caused, which is advantageous.

Next, writing and holding of data in the semiconductor device (a memory cell 250) illustrated in FIG. 4A will be described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the charge at the first terminal of the capacitor 254 is held (holding).

Because the off-state current of the transistor 162 is extremely small, the potential of the first terminal of the capacitor 254 (or the charge accumulated in the capacitor) can be held for a long time.

Next, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B*V_{B0}+C*V)/(C_B+C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1>V_0$), the potential of the bit line BL in the case of holding the potential $V_1$ ($=(C_B*V_{B0}+C*V_1)/(C_B+C)$) is higher than the potential of the bit line BL in the case of holding the potential $V_0$ ($=(C_B*V_{B0}+C*V_0)/(C_B+C)$).

Then, by comparing the potential of the bit line BL with a predetermined potential, data can be read.

As described above, the semiconductor device illustrated in FIG. 4A can hold charge that is accumulated in the capacitor 254 for a long time because the off-state current of the transistor 162 is extremely small. In other words, refresh operation becomes unnecessary or the frequency of the refresh operation can be extremely lowered, which leads to a sufficient reduction in power consumption. Moreover, stored data can be held for a long period even when power is not supplied.

Next, the semiconductor device illustrated in FIG. 4B will be described.

The semiconductor device illustrated in FIG. 4B includes a memory cell array 251 including a plurality of memory cells 250 illustrated in FIG. 4A and a memory cell array 252 including a plurality of memory cells 250 illustrated in FIG. 4A as memory elements in the upper portion, and a peripheral circuit 253 in the lower portion which is necessary for operating the memory cell array 251 and the memory cell array 252. Note that the memory cell array 252 is provided in an intermediate position between the memory cell array 251 and the peripheral circuit 253 and is provided over the peripheral circuit 253; thus, the memory cell array 251 and the memory cell array 252 are regarded as being provided in the upper portion.

In the structure illustrated in FIG. 4B, the peripheral circuit 253 can be provided under the memory cell array 251 and the memory cell array 252, and the memory cell array 251 and the memory cell array 252 can be stacked. Thus, the size of the semiconductor device can be decreased.

Next, a specific structure of the semiconductor device illustrated in FIG. 4B will be described with reference to FIG. 5.

Figure 5:
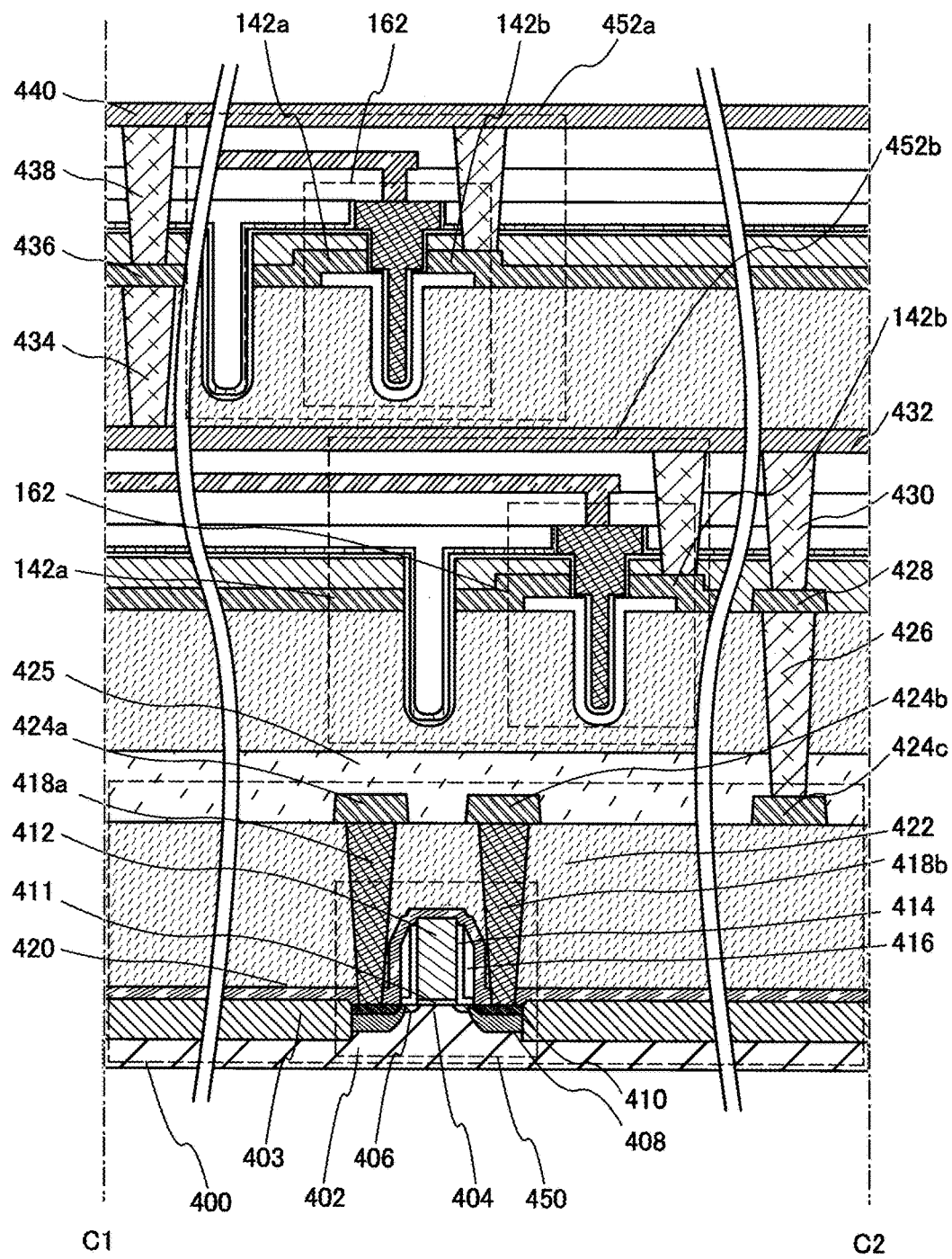
FIG. 5 is a cross-sectional view of one embodiment of the present invention.

The semiconductor device illustrated in FIG. 5 includes a plurality of memory cells (a memory cell 452a and a memory cell 452b) formed in multiple layers in the upper portion, and a peripheral circuit 400 in the lower portion. The peripheral circuit 400 in the lower portion includes a transistor 450 including a first semiconductor material, and the plurality of memory cells (the memory cell 452a and the memory cell 452b) formed in multiple layers in the upper portion each include a transistor 162 including a second semiconductor material. Note that FIG. 5 which is taken along line C1-C2 corresponds to a cross-sectional view perpendicular to the channel-length direction of transistors.

Here, the first semiconductor material and the second semiconductor material are preferably materials having different band gaps. For example, the first semiconductor material can be a semiconductor material (such as silicon) other than an oxide semiconductor, and the second semiconductor material can be an oxide semiconductor. A transistor including a material other than an oxide semiconductor can operate at high speed easily. On the other hand, a transistor including an oxide semiconductor can hold electric charge for a long time owing to its characteristics.

The transistor 162 including the second semiconductor material in the upper portion is the same as the transistor 162 described above in Embodiments 1 to 3; thus, for description of FIG. 5, the same reference numerals are used for the same parts as those in FIG. 1A and are not described in detail.

Here, the transistor 450 including the first semiconductor material in the lower portion will be described below.

The transistor 450 in FIG. 5 includes a channel formation region 404 provided in a substrate 402 including a semiconductor material (such as silicon), impurity regions 406 and high-concentration impurity regions 408 (collectively, simply also referred to as impurity regions) provided such that the channel formation region 404 is sandwiched therebetween, metal compound regions 410 provided in contact with the high-concentration impurity regions 408, a gate insulating layer 411 provided over the channel formation region 404, a gate electrode layer 412 provided in contact with the gate insulating layer 411, and a source or drain electrode 418a and a source or drain electrode 418b electrically connected to the impurity regions.

Here, a sidewall insulating layer 414 is provided on a side surface of the gate electrode layer 412. Further, an element isolation insulating layer 403 is formed on the substrate 402 so as to surround the transistor 450, and an interlayer insulating layer 420 and an interlayer insulating layer 422 are formed so as to cover the transistor 450. The source or drain electrode 418a and the source or drain electrode 418b are electrically connected to the metal compound regions 410 through openings formed in the interlayer insulating layer 420 and the interlayer insulating layer 422. In other words, the source or drain electrode 418a and the source or drain electrode 418b are electrically connected to the high-concentration impurity regions 408 and the impurity regions 406 through the metal compound regions 410. Note that in some cases, the sidewall insulating layer 414 is not formed, in order to achieve a higher degree of integration of the transistor 450 or the like. In addition, an electrode 424a, an electrode 424b, and an electrode 424c which are electrically connected to the source or drain electrode 418a and the source or drain electrode 418b of the transistor 450 are provided over the interlayer insulating layer 422, and planarization is achieved with an insulating layer 425 which covers the interlayer insulating layer 422, the electrode 424a, the electrode 424b, and the electrode 424c.

The electrode 424c is electrically connected to an electrode 428 through a connection electrode 426. Note that the electrode 428 is formed using the same layer as the source electrode layer and the drain electrode layer of the transistor 162.

In addition, a wiring 432 is electrically connected to the electrode 428 through a connection electrode 430 and is electrically connected to an electrode 436 which is formed using the same layer as the source electrode layer and the drain electrode layer of the transistor 162, through a connection electrode 434. In addition, the electrode 436 is electrically connected to a wiring 440 through a connection electrode 438.

With the electrode 424c, the wiring 432, and the wiring 440, an electrical connection between memory cells, an electrical connection between the peripheral circuit 400 and memory cells, or the like can be established.

Note that FIG. 5 illustrates, as an example, the semiconductor device in which two memory cells (the memory cell 452a and the memory cell 452b) are stacked; however, the number of memory cells to be stacked is not limited thereto. Three or more memory cells may be stacked.

In addition, FIG. 5 illustrates, as an example, the semiconductor device in which the memory cell 452a, the memory cell 452b, and the peripheral circuit 400 are connected through the electrode 424c, the electrode 428, the wiring 432, the electrode 436, and the wiring 440; however, the present invention is not limited thereto. Two or more wiring layers and electrodes may be provided between the memory cell 452a, the memory cell 452b, and the peripheral circuit 400.

As described above, the plurality of memory cells formed in multiple layers in the upper portion is each formed with a transistor including an oxide semiconductor as a wide-gap semiconductor layer. Since the off-state current of the transistor including an oxide semiconductor as a wide-gap semiconductor layer is small, stored data can be held for a long time owing to such a transistor. In other words, the frequency of refresh operation can be extremely lowered, which leads to a sufficient reduction in power consumption. On the other hand, for the peripheral circuit, a semiconductor material other than the oxide semiconductor is used. The semiconductor material other than the oxide semiconductor may be, for example, silicon, germanium, silicon germanium, silicon carbide, gallium arsenide, or the like and is preferably a single crystal semiconductor. Alternatively, an organic semiconductor material or the like may be used. A transistor including such a semiconductor material can operate at sufficiently high speed. Therefore, the transistor including the material other than the oxide semiconductor can favorably realize a variety of circuits (e.g., a logic circuit or a driver circuit) which needs to operate at high speed.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

This embodiment can be implemented in appropriate combinations with the configurations described in the other embodiments.

Embodiment 5

In this embodiment, examples of application of the semiconductor device described in any of the above embodiments to portable devices such as cellular phones, smartphones, or electronic books will be described with reference to FIGS. 9A and 9B and FIGS. 10 to 12.

In a portable device such as a cellular phone, a smartphone, or an electronic book, an SRAM or a DRAM is used so as to store image data temporarily. The reason why an SRAM or a DRAM is used is that a flash memory is slow in responding and is not suitable for image processing. On the other hand, an SRAM or a DRAM has the following characteristics when used for temporary storage of image data.

Figure 9A:
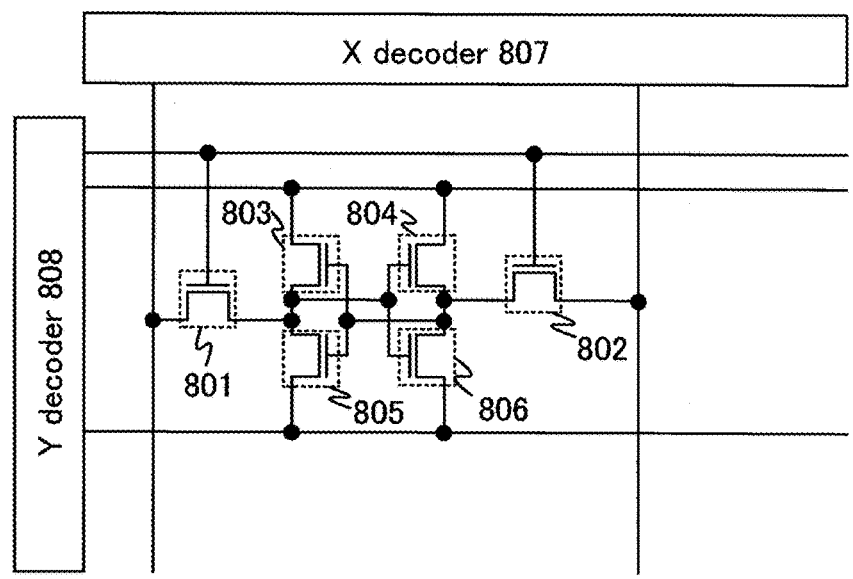
FIGS. 9A and 9B are circuit diagrams of one embodiment of the present invention.

In an ordinary SRAM, as illustrated in FIG. 9A, one memory cell includes six transistors, that is, transistors 801 to 806, which are driven with an X decoder 807 and a Y decoder 808. The transistor 803 and the transistor 805, and the transistor 804 and the transistor 806 form inverters, which enables high-speed driving. However, because one memory cell includes six transistors, a large cell area is one disadvantage. Provided that the minimum feature size of a design rule is F, the area of a memory cell in an SRAM is generally 100 $F^2$ to 150 $F^2$. Therefore, the price per bit of an SRAM is the most expensive among memory devices.

Figure 9B:
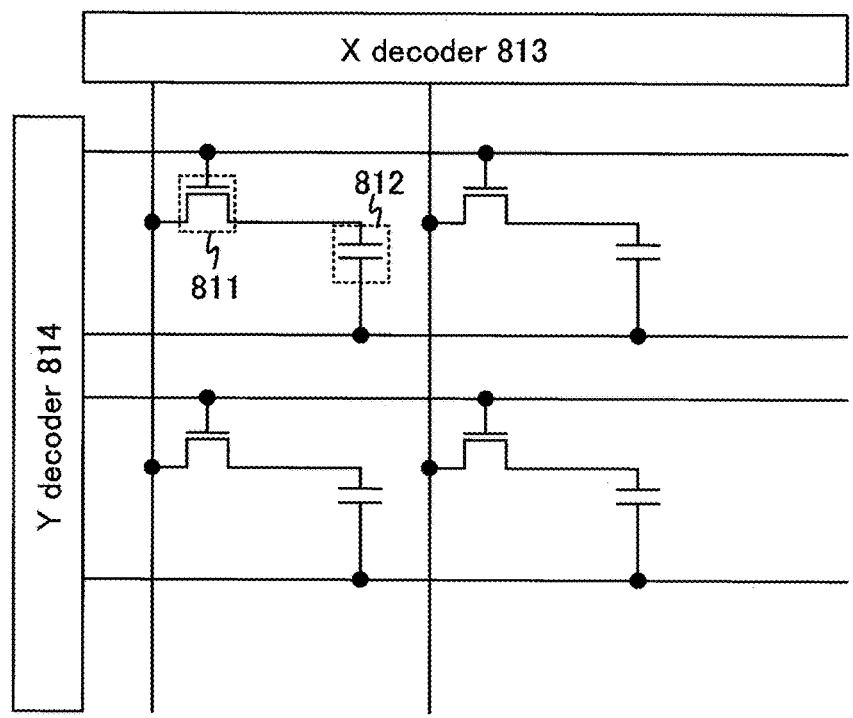

In a DRAM, as illustrated in FIG. 9B, a memory cell includes a transistor 811 and a storage capacitor 812, which are driven with an X decoder 813 and a Y decoder 814. One cell is configured with one transistor and one capacitor and has a small area. The area of a memory cell in a DRAM is generally 10 $F^2$ or less. Note that the DRAM needs to be refreshed periodically and consumes electric power even when a rewriting operation is not performed.

On the other hand, the memory cell of the semiconductor device described in any of the above embodiments has an area of approximately 10 $F^2$ and does not need to be refreshed frequently. Therefore, the area of a memory cell can be decreased, and power consumption can be reduced.

Figure 10:
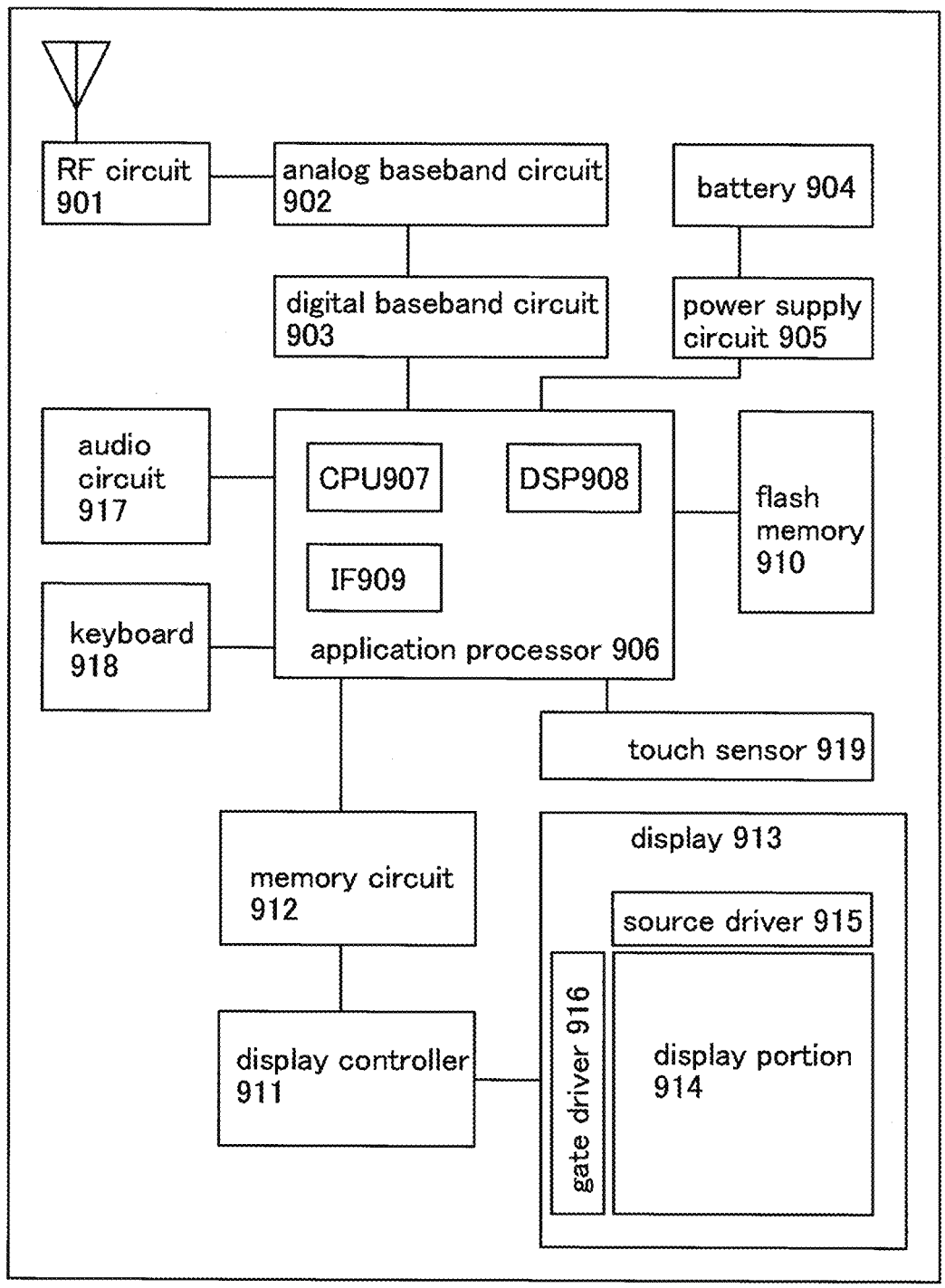
FIG. 10 is a block diagram of a portable device of one embodiment of the present invention.

Next, FIG. 10 is a block diagram of a portable device. The portable device illustrated in FIG. 10 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM. By employing the semiconductor device described in any of the above embodiments for that portion, data can be written and read at high speed and can be held for a long time, and power consumption can be sufficiently reduced.

Figure 11:
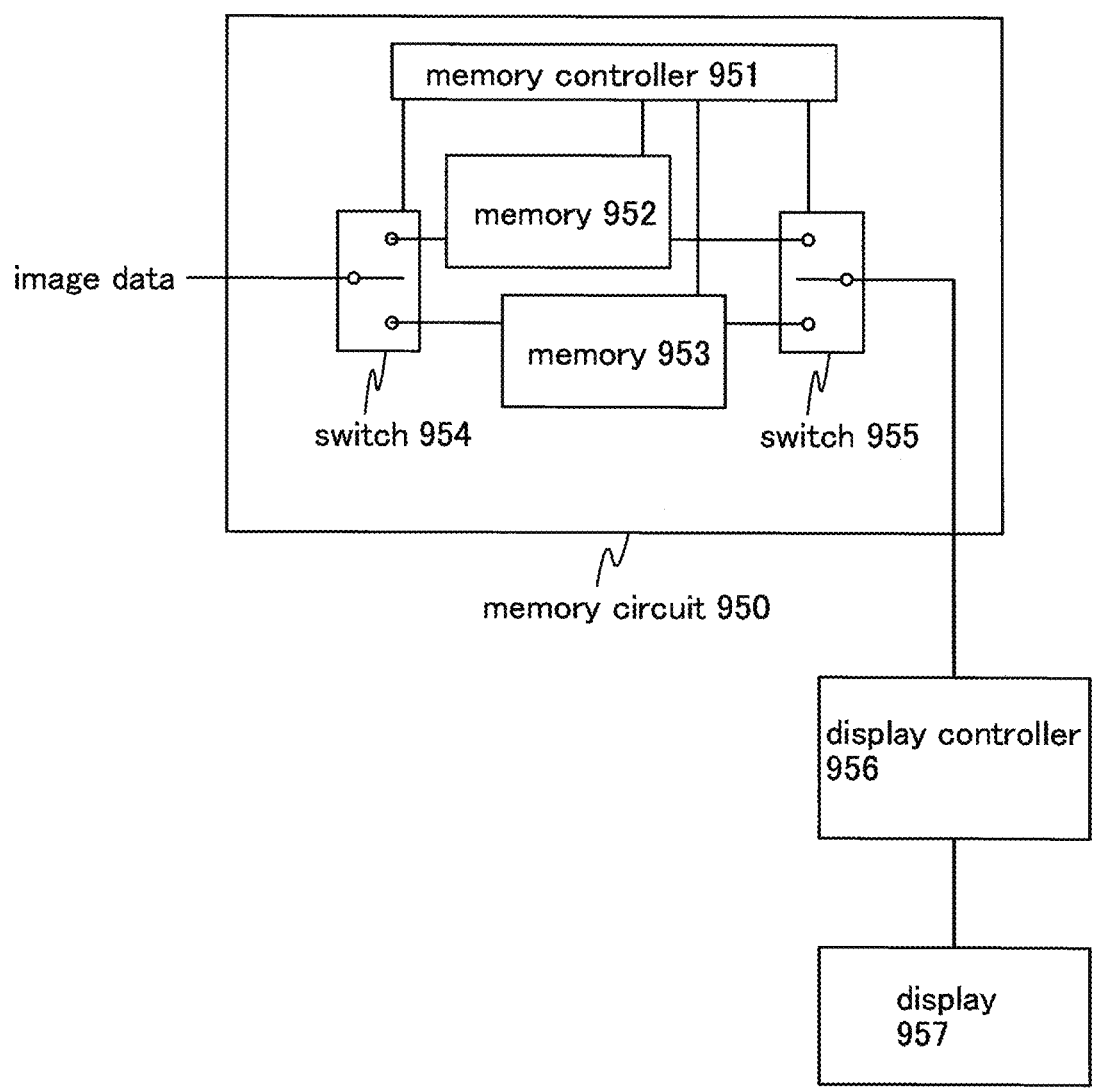
FIG. 11 is a block diagram of a semiconductor device of one embodiment of the present invention.

Next, FIG. 11 illustrates an example of using the semiconductor device described in any of the above embodiments in a memory circuit 950 for a display. The memory circuit 950 illustrated in FIG. 11 includes a memory 952, a memory 953, a switch 954, a switch 955, and a memory controller 951. The memory circuit 950 is connected to a display controller 956 that reads and controls image data input through a signal line (input image data) and data stored in the memory 952 and the memory 953 (stored image data), and is also connected to a display 957 that displays an image based on a signal input from the display controller 956.

First, image data (input image data A) is produced by an application processor (not illustrated). The input image data A is stored in the memory 952 through the switch 954. Then, the image data stored in the memory 952 (stored image data A) is transmitted to the display 957 through the switch 955 and the display controller 956, and is displayed on the display 957.

When the input image data A remains unchanged, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during that time, the stored image data A is regularly read from the memory 952 through the switch 955. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation continues until the next new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 12:
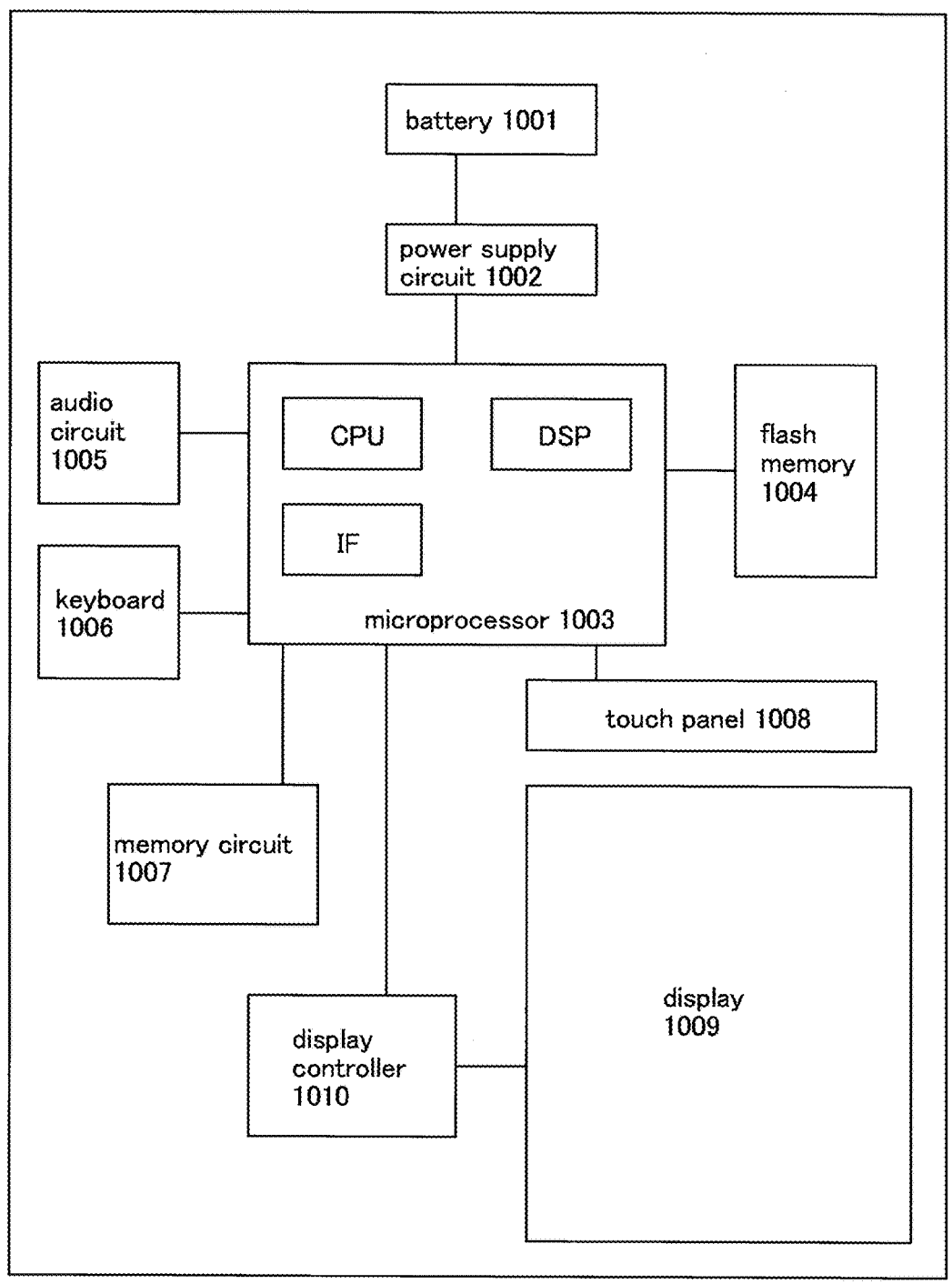
FIG. 12 is a block diagram of an electronic book of one embodiment of the present invention.

Next, FIG. 12 is a block diagram of an electronic book. FIG. 12 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 12. The memory circuit 1007 has a function to temporarily hold the contents of a book. For example, a user may use a highlight function. In some cases, a user wants to mark a specific portion while reading an electronic book. This marking function is called highlight function and is used to make a difference from the other portions by changing the display color, underlining, making characters bold, changing the font of characters, or the like. The function makes it possible to store and hold data of a portion specified by a user. In order to store the data for a long time, the data may be copied to the flash memory 1004. Also in such a case, by employing the semiconductor device described in any of the above embodiments, data can be written and read at high speed and held for a long time, and power consumption can be sufficiently reduced.

As described above, the portable devices described in this embodiment each incorporates the semiconductor device according to any of the above embodiments. Therefore, it is possible to obtain a portable device which is capable of reading data at high speed, holding data for a long time, and reducing power consumption.

The configurations, methods, and the like described in this embodiment can be combined as appropriate with any of the configurations, methods, and the like described in the other embodiments.

Example 1

In this example, calculations were carried out to determine whether or not a short-channel effect is caused in the transistor having a trench structure which is described in Embodiment 1.

For the calculations, device simulation software Sentaurus Device manufactured by Synopsys, Inc. was used.

Figure 6A:
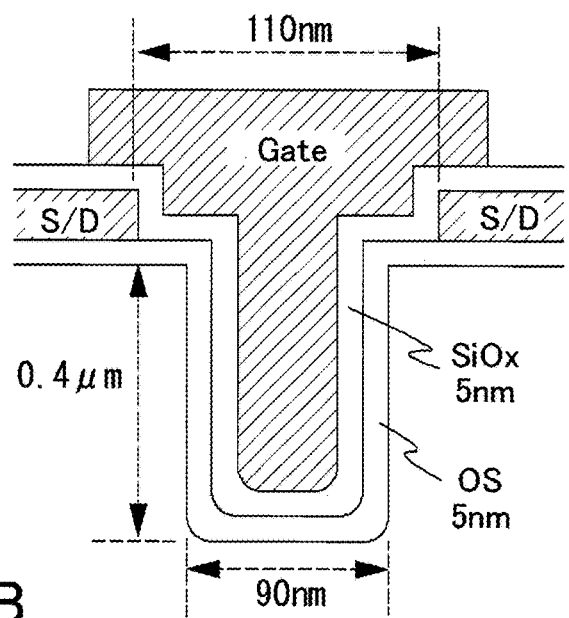
FIGS. 6A and 6B are a cross-sectional view of a structure used for calculation and results of the calculation.
Figure 6B:
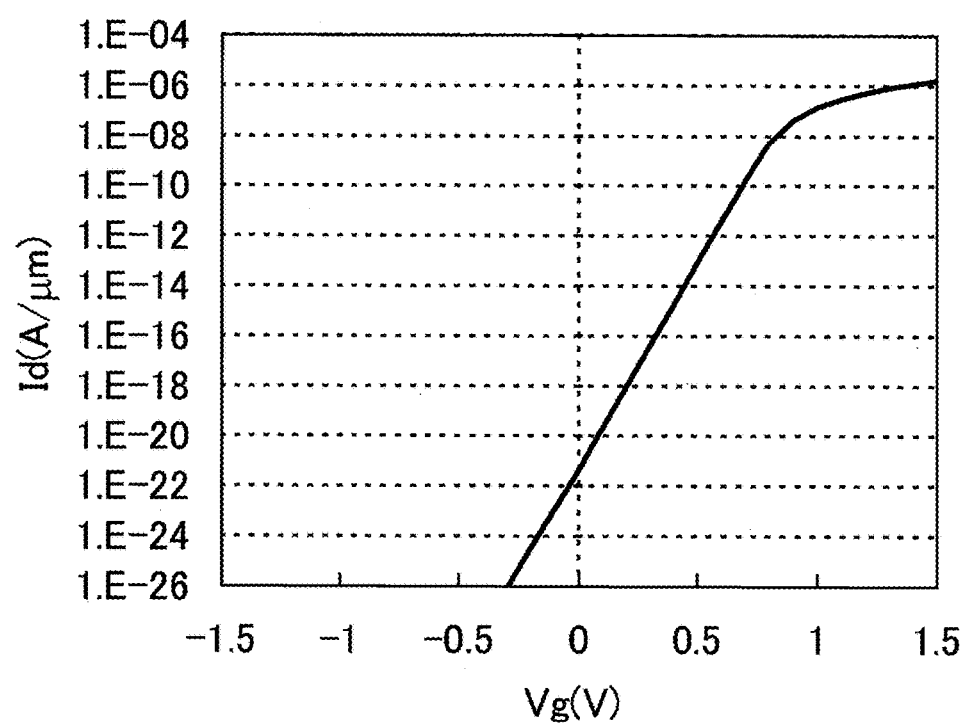

FIG. 6A shows a structure used for the calculation and the sizes of components. The thickness of the gate insulating layer is set to 5 nm, the thickness of the wide-gap semiconductor layer is set to 5 nm, and the depth of the trench for the gate electrode is set to 0.4 μm. FIG. 6A shows a transistor having a trench structure in which the length of the bottom of the trench (the length in the channel-length direction) is 90 nm and the distance between the source electrode and the drain electrode (the length in the channel-length direction) is 110 nm. A material of the wide-gap semiconductor layer is an In—Ga—Zn—O-based oxide semiconductor (with a band gap of 3.15 eV, an electron affinity of 4.6 eV, and an electron mobility of 10 cm$^2$/Vs), the work function of the electrodes in contact with the wide-gap semiconductor layer (the source electrode and the drain electrode) is 4.6 eV, and the work function of the gate electrode is 5.5 eV. FIG. 6B shows the result of a calculation of Vg-Id characteristics of the transistor having the trench structure (with Vds=1 V at a temperature of 27° C.).

Figure 7A:
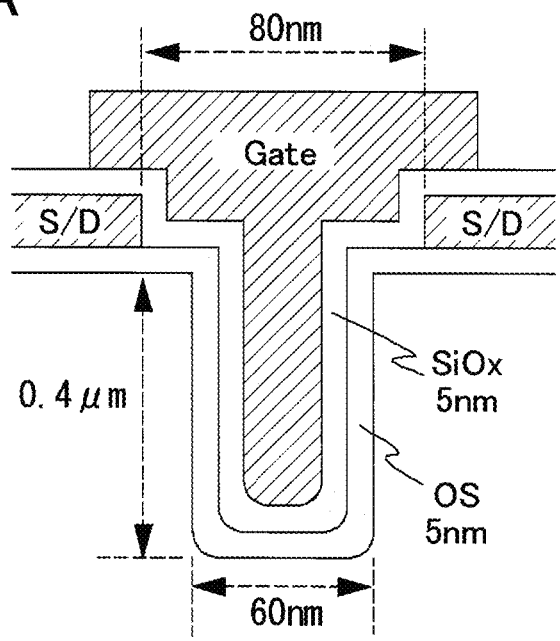
FIGS. 7A and 7B are a cross-sectional view of a structure used for calculation and results of the calculation.
Figure 7B:
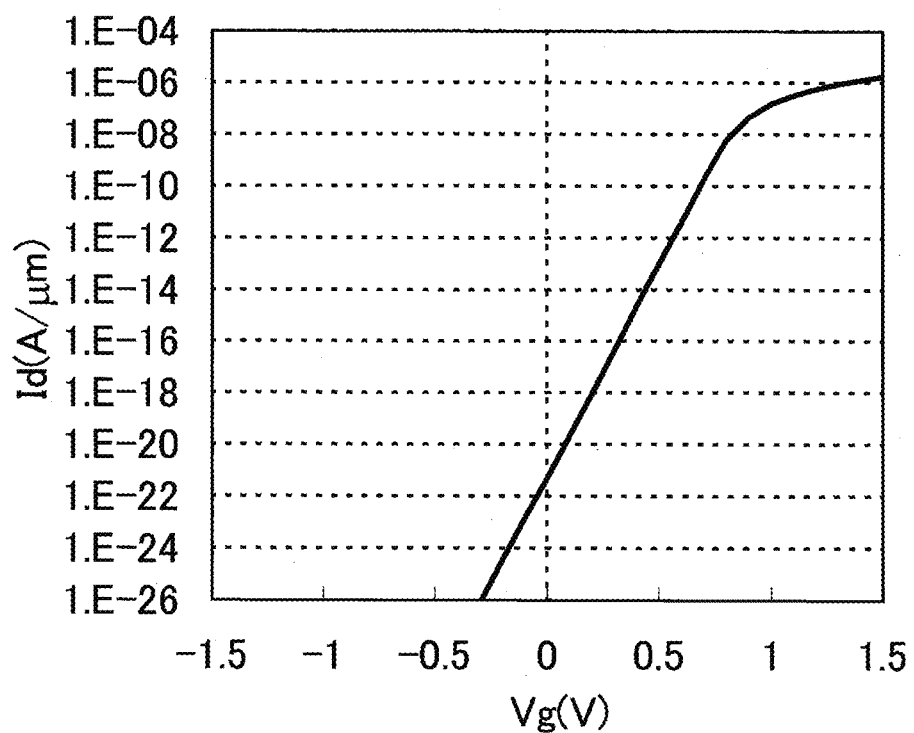

FIG. 7A shows a transistor having a trench structure in which the length of the bottom of the trench (the length in the channel-length direction) is 60 nm and the distance between the source electrode and the drain electrode (the length in the channel-length direction) is 80 nm. FIG. 7B shows the result of a calculation carried out with the same conditions as in FIG. 6B except the length of the bottom of the trench and the distance between the source electrode and the drain electrode.

Figure 8A:
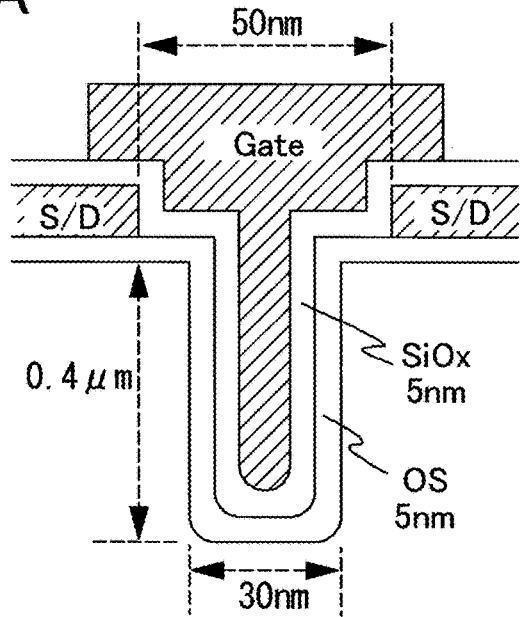
FIGS. 8A and 8B are a cross-sectional view of a structure used for calculation and results of the calculation.
Figure 8B:
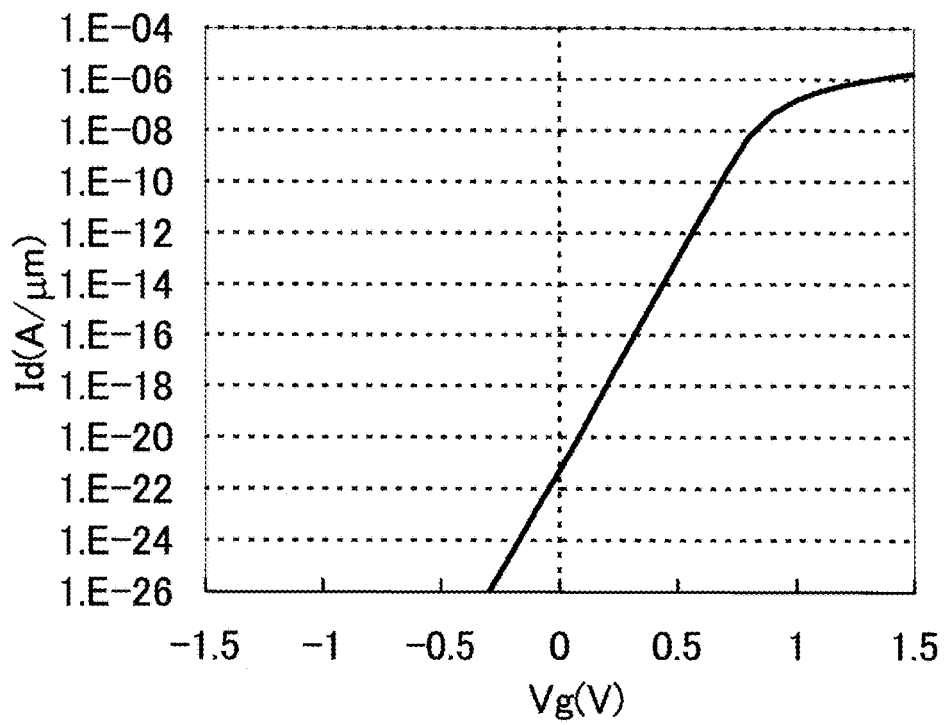

FIG. 8A shows a transistor having a trench structure in which the length of the bottom of the trench (the length in the channel-length direction) is 30 nm and the distance between the source electrode and the drain electrode (the length in the channel-length direction) is 50 nm. FIG. 8B shows the result of a calculation carried out with the same conditions as in FIG. 6B except the length of the bottom of the trench and the distance between the source electrode and the drain electrode.

The results of the calculations show that all the transistors having the structures in FIGS. 6A, 7A, and 8A have substantially the same characteristics. The threshold voltage (Vth) of each transistor is 0.8 V and the subthreshold swing (S value) thereof is 60 mV/dec, which are favorable values.

These calculation results reveal that a short-channel effect such as a negative shift of the threshold voltage or an increase in the subthreshold swing is not caused even when the distance between the source electrode and the drain electrode (the length in the channel-length direction) is decreased to 50 nm, and favorable transistor characteristics are obtained.

For comparison, similar calculations were carried out using transistors having not a trench structure but a planar structure. As the distance between the source electrode and the drain electrode (the length in the channel-length direction) decreased, the channel length also decreased. A short-channel effect such as a negative shift of the threshold voltage or an increase in the subthreshold swing was caused. Furthermore, an increase in leakage current (off-state current) generated when a negative bias was applied to the gate was also observed.

Compared with the results of the comparative calculations, the results of the calculations in FIGS. 6B, 7B, and 8B are favorable. With the transistor structure described in Embodiment 1, the change in substantial channel length is small even when the distance between the source electrode and the drain electrode (the length in the channel-length direction) is decreased. Therefore, a short-channel effect is not caused, and off-state current can be small. Accordingly, a memory cell having favorable retention characteristics can be produced.

This application is based on Japanese Patent Application serial no. 2011-014628 filed with Japan Patent Office on Jan. 26, 2011 and Japanese Patent Application serial no. 2011-112673 filed with Japan Patent Office on May 19, 2011, the entire contents of which are hereby incorporated by reference.

What is claimed is:

1. A semiconductor device comprising:
a first insulating layer;
a first trench in the first insulating layer;
a wide-gap semiconductor layer in contact with the first insulating layer, wherein the wide-gap semiconductor layer comprising:
a first region adjacent to a first side wall of the first trench;
a second region adjacent to a bottom surface of the first trench; and
a third region adjacent to a second side wall of the first trench, the first side wall of the first trench being opposite to the second side wall of the first trench;
a source electrode on a first region of the first insulating layer, the source electrode being in electrical contact with the wide-gap semiconductor layer;
a drain electrode on a second region of the first insulating layer, the drain electrode being in electrical contact with the wide-gap semiconductor layer, wherein the first trench is located between the first region of the first insulating layer and the second region of the first insulating layer;
a gate insulating layer adjacent to the wide-gap semiconductor layer; and
a gate electrode in the first trench and adjacent to the wide-gap semiconductor layer with the gate insulating layer interposed therebetween,
wherein the wide-gap semiconductor layer is in contact with a whole surface of the trench, and
wherein the gate insulating layer is in contact with a whole surface of the wide-gap semiconductor layer in the trench.

2. The semiconductor device according to claim 1, further comprising:
a second trench in the first insulating layer; and
a second insulating layer filling the second trench.

3. The semiconductor device according to claim 1,
wherein the gate insulating layer is in contact with a side surface of the wide-gap semiconductor layer.

4. The semiconductor device according to claim 1,
wherein the wide-gap semiconductor layer has a cross-sectional shape of a U shape, and
wherein the wide-gap semiconductor layer includes a crystal having a c-axis perpendicular to a surface of the wide-gap semiconductor layer.

5. A semiconductor device comprising:
a circuit comprising a transistor comprising a semiconductor material; and
a memory cell over and electrically connected to the circuit, the memory cell comprising:
a first insulating layer;
a first trench in the first insulating layer;
a wide-gap semiconductor layer in contact with an inner wall surface of the first trench, wherein the wide-gap semiconductor layer comprising:
a first region adjacent to a first side wall of the first trench;
a second region adjacent to a bottom surface of the first trench; and
a third region adjacent to a second side wall of the first trench, the first side wall of the first trench being opposite to the second side wall of the first trench;
a source electrode on a first region of the first insulating layer, the source electrode being in electrical contact with the wide-gap semiconductor layer;
a drain electrode on a second region of the first insulating layer, the drain electrode being in electrical contact with the wide-gap semiconductor layer, wherein the first trench is located between the first region of the first insulating layer and the second region of the first insulating layer;
a second insulating layer adjacent to the wide-gap semiconductor layer; and
a gate electrode in the first trench and adjacent to the wide-gap semiconductor layer with the second insulating layer interposed therebetween,
wherein the semiconductor material is different from a material of the wide-gap semiconductor layer, wherein the wide-gap semiconductor layer is in contact with a whole surface of the first trench, and wherein the second insulating layer is in contact with a whole surface of the wide-gap semiconductor layer in the first trench.

6. The semiconductor device according to claim 5, further comprising:

a second trench in the first insulating layer, wherein the second insulating layer is adjacent to an inner wall surface of the second trench; and a third insulating layer filling the second trench.

7. The semiconductor device according to claim 6, wherein the inner wall surface of the second trench comprises at least a bottom surface of the second trench.

8. The semiconductor device according to claim 6, wherein a horizontal position of a bottom of the second trench is deeper than a horizontal position of a bottom of the first trench.

9. The semiconductor device according to claim 5, wherein the source electrode or the drain electrode is in contact with the wide-gap semiconductor layer.

10. The semiconductor device according to claim 5, wherein the second insulating layer is in contact with a side surface of the wide-gap semiconductor layer.

11. The semiconductor device according to claim 5, wherein the wide-gap semiconductor layer has a cross-sectional shape of a U shape, and wherein the wide-gap semiconductor layer includes a crystal having a c-axis perpendicular to a surface of the wide-gap semiconductor layer.

\* \* \* \* \*